United States Patent [19]

Endo et al.

[11] Patent Number: 5,010,465
[45] Date of Patent: Apr. 23, 1991

[54] OPTICAL LIGHTING SYSTEM

[75] Inventors: Kenji Endo; Shinichi Nagata, both of Kyoto, Japan

[73] Assignee: Dainippon Screen Mfg. Co., Ltd., Japan

[21] Appl. No.: 225,039

[22] Filed: Jul. 27, 1988

[30] Foreign Application Priority Data

Jul. 31, 1987 [JP] Japan .................................. 62-193330
Jun. 20, 1988 [JP] Japan .................................. 63-153305

[51] Int. Cl.$^5$ ................................................ F21V 5/00
[52] U.S. Cl. .................................... 362/337; 362/335
[58] Field of Search ....................... 350/409, 432, 452; 362/311, 326, 335, 337

[56] References Cited

U.S. PATENT DOCUMENTS 3,598,477 8/1971 Levin ................................ 362/335 X
4,451,872 5/1984 Hartwig ........................... 362/335 X

OTHER PUBLICATIONS

Rhodes, P. W. and Shealy, D. L. "Refractive Optical Systems for Irradiance Redistribution of Collimated Radiation: Their Design and Analysis." *Applied Optics*, vol. 19, No. 20, (Oct. 15, 1980), pp. 3545-3553.

Chang-Yuan Han, Yukihiro Ishii, Kazumi Murata, "Reshaping Collimated Laser Beams with Gaussian Profile to Uniform Profiles." *Applied Optics*, vol. 22, No. 22, (Nov. 15, 1983), pp. 3644-3647.

*Primary Examiner*—Stephen F. Husar
*Attorney, Agent, or Firm*—Ostrolenk, Faber, Gerb & Soffen

[57] ABSTRACT

An optical lighting system comprising either an optical system or an optical mirror system. In the optical lens and optical mirror systems, the light incident and exiting planes of the lenses and mirrors, are formed to satisfy given equations. Accordingly, in a contact or proximity exposure system, it is possible to unify irradiance on a surface to be irradiated and reduce the optical path length, thus reducing the overall device size. In a projection system, it is possible to unify irradiance on an image surface while efficiently utilizing light by ommitting a gradient filter.

2 Claims, 12 Drawing Sheets

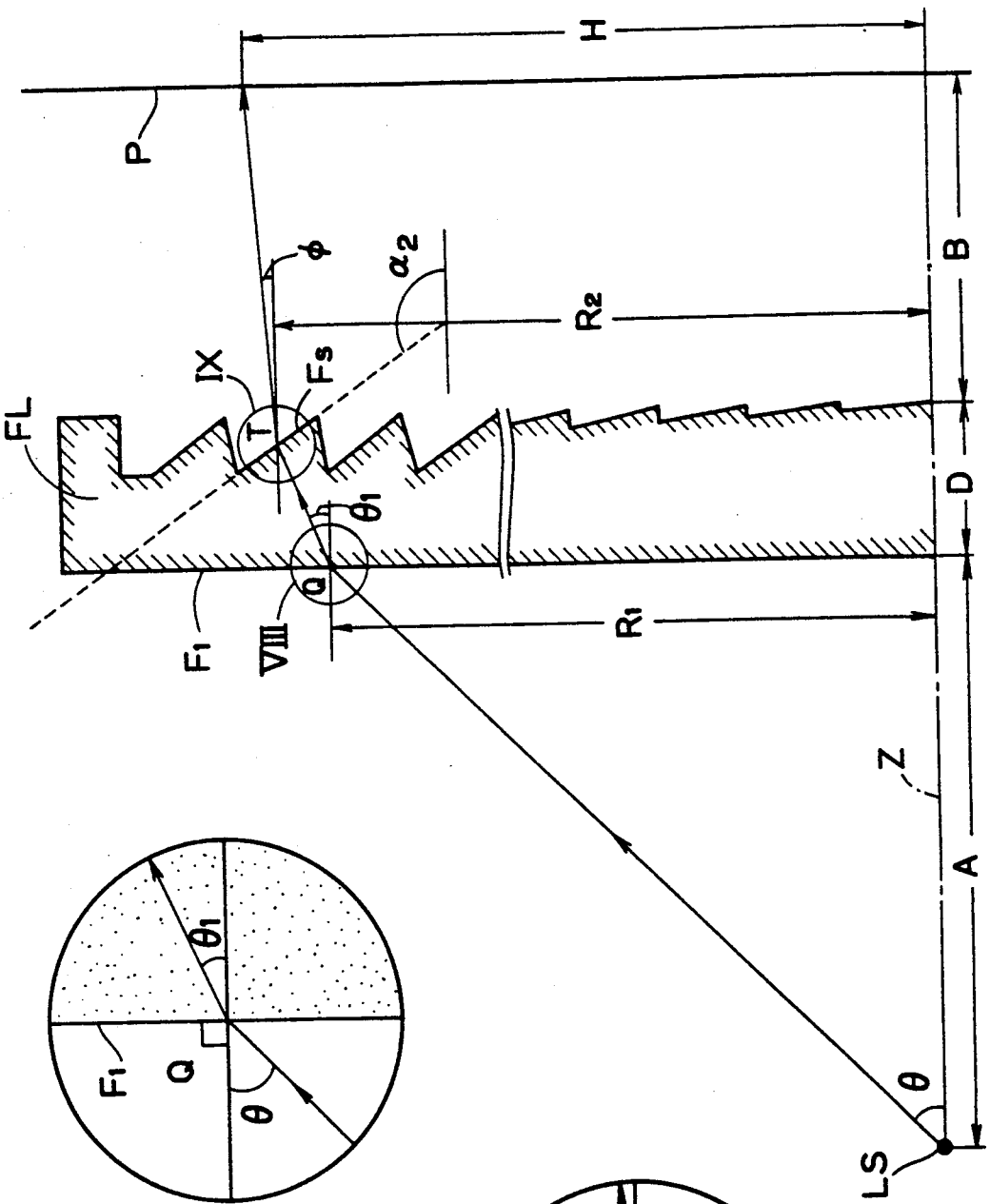

OPTICAL LIGHTING SYSTEM

BACKGROUND OF THE INVENTION

1. Field of the Invention

The present invention relates to an optical lighting system which can be used as an original irradiator in a proximity exposure device for printing circuit patterns of a printed-wiring board; an integrated circuit, and the like, onto a substrate. The present invention is also useful in a contact printer and a process camera for printing the image of an original process film onto a machine plate, and the like. More particularly, the present invention relates to an optical lighting system which can uniformly irradiate the total area of a surface to be irradiated in a proximity exposure device and a contact printer (hereinafter these are simply referred to as a contact or proximity exposure system), or can perform irradiation such that the irradiance of an image surface is uniform in a process camera and the like (hereinafter simply referred to as a projection system).

2. Description of the Prior Art

FIG. 1 illustrates a conventional optical lighting system of a contact or proximately exposure system according to "OPTICAL ENGINEERING HANDBOOK" published by ASAKURA SHOTEN in February, 1986, p. 682. FIG. 2 illustrates a conventional optical lighting system of a projection system.

Referring to FIG. 1, the conventional optical lighting system of a contact or proximity exposure system basically comprises a light source LS; a so-called fly's eye lens OS located in the vicinity of the second focal point of an elliptical mirror EM (for conveging light emitted from the light source LS); and a collimator lens CL located between the fly's eye lens OS and a surface P to be irradiated. The fly's eye lens OS is which is a lens which is formed by arranging a plurality of element lenses on a plane perpendicular to the optical axis of the element lenses. Reflection mirrors M₂ and M₃ act to change the advancing direction of the light. The real image of an exit pupil of the elliptical mirror EM is formed in the vicinity of the front focal point of the collimator lens CL through the fly's eye lens OS. The real image of an exit pupil of the fly's eye lens OS is formed on the surface P to be irradiated through the collimator lens CL. According to this optical lighting system, even if a small gap between an original pattern OG, placed on the surface P to be irradiated, and a photosensitive material PM occurs, gradation or misregistration of a printed pattern image can be prevented, since printing is performed by parallel light. Furthermore, irradiance is increased as high as possible by forming the real image of the exit pupil of the fly's eye lens OS, which is secondary light source, on the surface P to be irradiated. Still further, irradiance distribution is unified by correcting the nonuniform quantity of light caused at the second focal point of the elliptical mirror EM, through the fly's eye lens OS. The collimator lens CL having a long focal length is used since it is necessary to unify irradiance distribution on the surface P to be irradiated.

Referring to FIG. 2, the conventional optical lighting system of a projection system comprises: a number of light source lamps 11 arranged in a light source box 10; a light diffusion plate 12 located in front of the light source box 10: and a gradient filter GF located between the light diffusion plate 12 and an original OG. The gradient filter GF is constructed such that the transmittance of light therethrough becomes lower as it approaches the center. The original OG is irradiated through the gradient filter GF so that irradiance in the peripheral portion of the original's surface (i.e., a surface P to be irradiated) becomes higher, whereby irradiance on an image surface P' is unified. Namely, lowering of irradiance in the peripheral portion of the image surface P', which is caused by a projection lens IL in accordance with the "$\cos^4 \theta$ law", is corrected by the gradient filter GF.

In the conventional optical lighting system as hereinbefore described, an area of uniform irradiance on the surface P decreases when the optical path length is reduced to decrease the overall size of the device. Therefore, it is necessary to lengthen the optical path length in order to enlarge the area of uniform illuminance. Concomitantly, the overall size of the device is increased.

On the other hand, in the conventional projection optical lighting system as hereinbefore described, the quantity of light utilized is inefficient since the gradient filter GF is interposed in the optical path and is needed to unify the irradiance of the image surface

SUMMARY OF THE INVENTION

According to a first aspect of the invention, an optical lighting system is provided which comprises an optical lens system including a lens which has an incident light plane, an exiting light plane and an optical axis, the system being placed between a light source and a surface to be irradiated. Irradiance at a irradiation height H on the surface to be irradiated is defined as S(H), and a relationship between an angle $\theta$, which a ray proceeding from the light source to the incident light plane of the lens optical system makes with the optical axis, and the irradiation height H is defined as the following equation (1):

$$\int S(H)H dH = \int J(\theta) \sin \theta d\theta \ldots \quad (1)$$

Thus, an angle $\alpha_1$, which the plane of incidence at a given incident height of the lens optical system makes with the optical axis is defined by the following equation (2):

$$\tan \alpha_1 = (-n \cos \theta_1 + \cos \theta)/(n \sin \theta_1 - \sin \theta) \ldots \quad (2)$$

and an angle $\alpha_2$, which the exiting light plane at a given exiting height of the optical lens system makes with the optical axis, is defined by the following equation (3):

$$\tan \alpha_2 = (-n \cos \theta_1 + \cos \Phi)/(n \sin \theta_1 - \sin \Phi) \ldots \quad (3)$$

where, n is the refractive index of the lens optical system, $J(\theta)$ is the radiant intensity of the light source in the direction of an angle $\theta$ with respect to the optical axis, $\theta_1$ is an angle which a ray proceeding through the optical lens system to the exiting light plane makes with the optical axis, and $\phi$ is an angle which a ray proceeding from the optical lens system at a given exiting height on the exiting light place of the optical lens system makes with the optical axis.

According to another aspect of the invention, an optical lighting system is provided which comprises an optical mirror system, having a reflecting surface and a optical axis, which is placed in the rear of a light source to irradiate a surface which is located in front of the light source. Irradiance at an irradiation height H on the surface to be irradiated is defined as S(H), and the relationship between angle $\theta$, which a ray proceeding from the light source to the reflecting surface of the optical mirror system makes with the optical axis, and the irradiation height H is defined as the following equation (4):

$$\int S(H)HdH = \int J(\theta_1)\sin\theta_1 d\theta_1 + \int J(\theta)K(\beta)\sin\theta d\theta. \quad (4)$$

Thus, an angle $\alpha_3$, which the reflecting surface at a given incident height of the optical mirror system makes with the optical axis, is defined by the following equation (5):

$$\tan\alpha_3 = 1/\tan\{(\theta-\phi)/2\}... \quad (5)$$

where $\theta$ is an angle which a ray proceeding from the light source to the mirror optical system makes with the optical axis, $\theta_1$ is an angle which a ray proceeding from the light source directly to the irradiation height H makes with the optical axis, $J(\theta_1)$ and $J(\theta)$ are the radiant intensity of the light source in the directions of angles of $\theta_1$ and $\theta$, respectively, with respect to the optical axis, $K(\beta)$ is a reflection factor of the mirror optical system wherein the incident angle is $(\beta)$, and $\phi$ is an angle which a ray proceeding from the given incident height of the mirror optical system to the irradiation height H makes with the optical axis.

According to the present invention, the optical path length from a light source to a surface to be irradiated can be greatly decreased without reduction of irradiance in the peripheral portion of the surface to be irradiated in a contact or proximity exposure system. As a result, the overall size of the irradiator can be decreased. Furthermore, irradiance on an image surface can be unified without interposing a gradient filter, and the like, in the optical path in a projection system. As a result, the light is efficiently utilized.

Accordingly, it is an object of the present invention to provide an optical lighting system which can unify irradiance on a surface to be irradiated and decrease the optical path length thereby decreasing the overall device size, in a contact or proximity exposure system, and can unify irradiance on an image surface while efficiently utilizing light quantity without using a gradient filter and the like, in a projection system.

These and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a view showing a Fresnel lens according to another embodiment of the optical lighting system in accordance with the present invention.

FIG. 8 and FIG. 9 are enlarged views showing the portions VIII and IX of FIG. 7, respectively.

DETAILED DESCRIPTION OF THE PREFERRED EMBODIMENTS

An optical lighting system according to the present invention includes a optical lens system or an optical mirror system. In the following description, the principle of the present invention when utilizing an optical lens system will be described in reference FIG. 3 to FIG. 9. The principle of the present invention when utilizing an optical mirror system will be described in reference to FIG. 10 to FIG. 12. The light source used in the optical lighting system according to these embodiments is sufficiently small in comparison with the aperture diameter and focal length of the optical lighting system, and the radiant intensity of $J(\theta)$ of the light source is symmetrical with respect to the optical axis of the optical lighting system.

Figure 1:
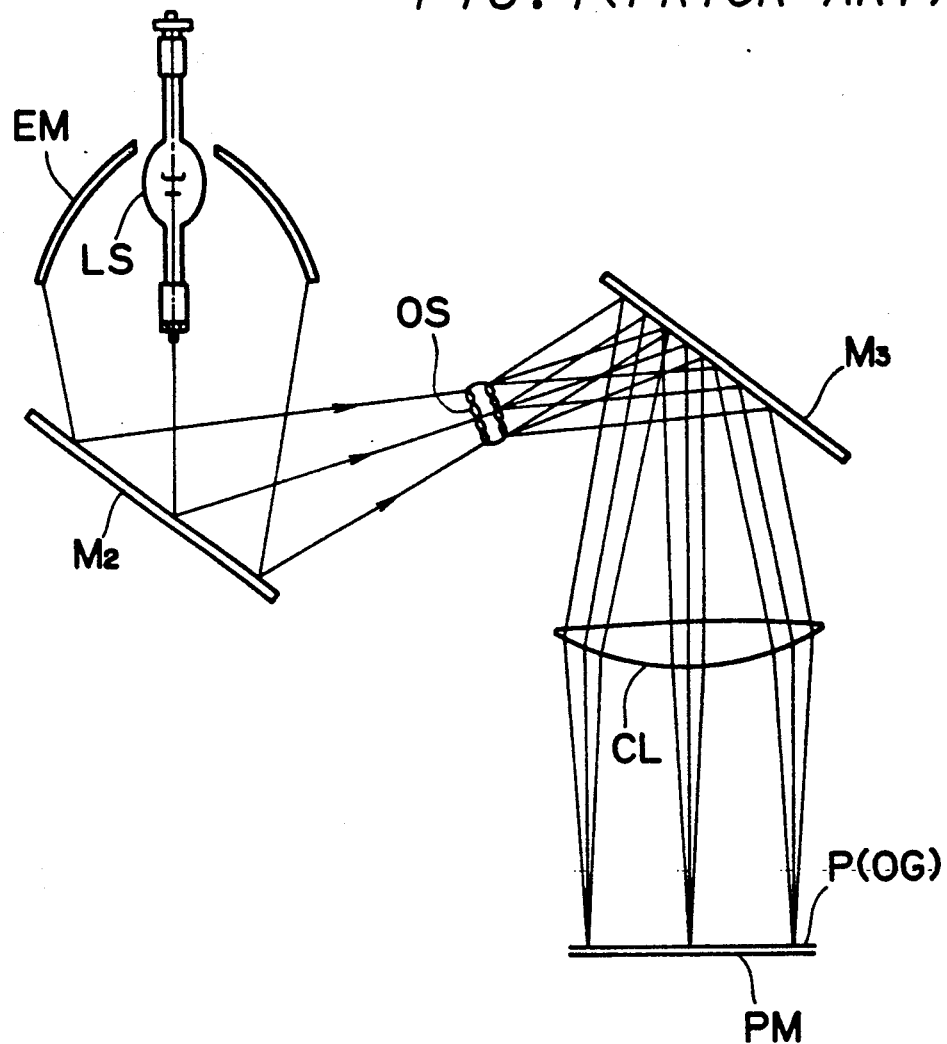
FIG. 1 and FIG. 2 illustrate prior art lighting systems.
Figure 2:
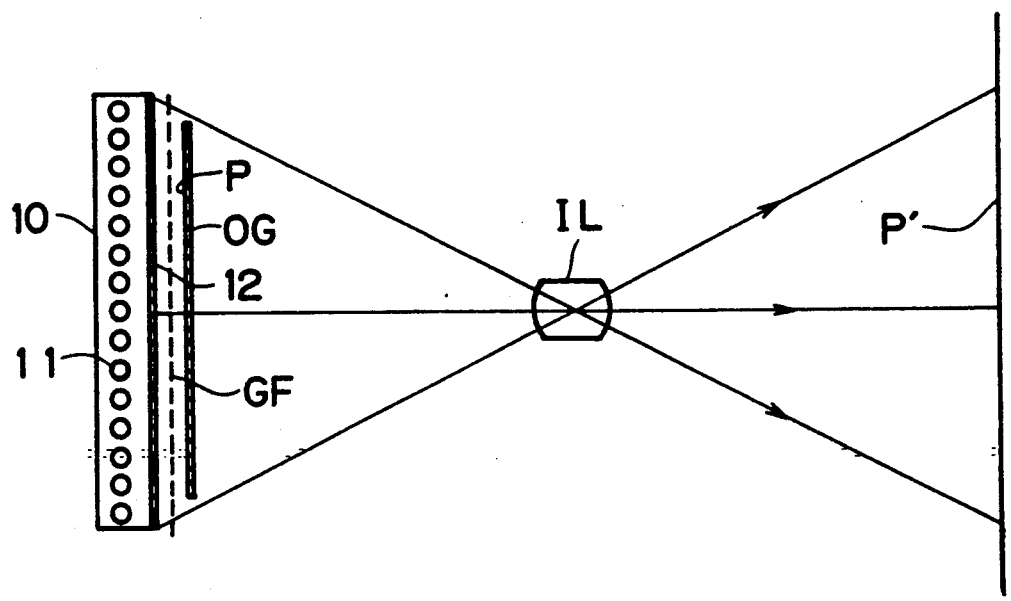
Figure 3:
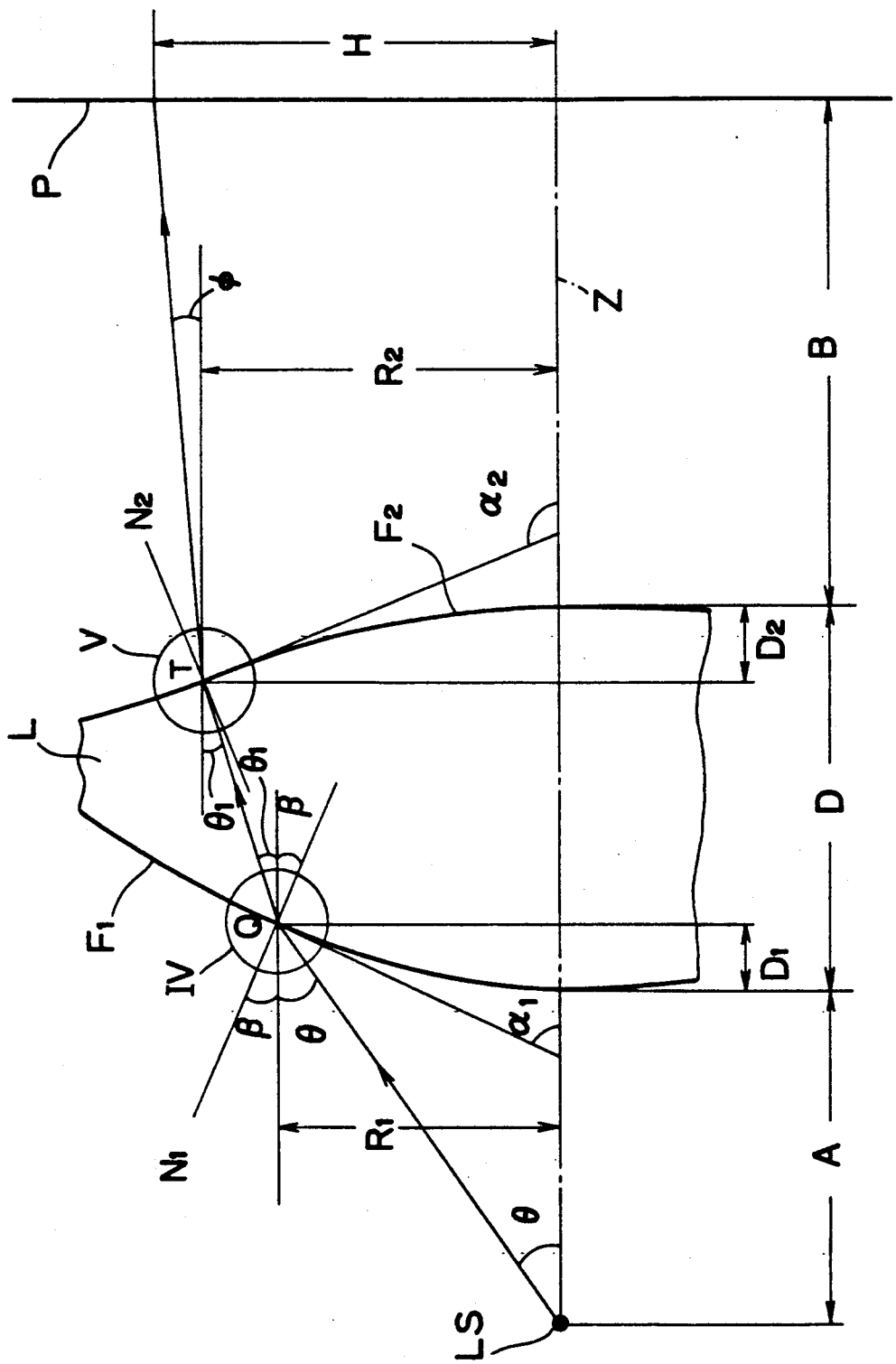
FIG. 3 is a view showing a lens optical system according to an embodiment of an optical lighting system in accordance with the present invention.
Figure 6:
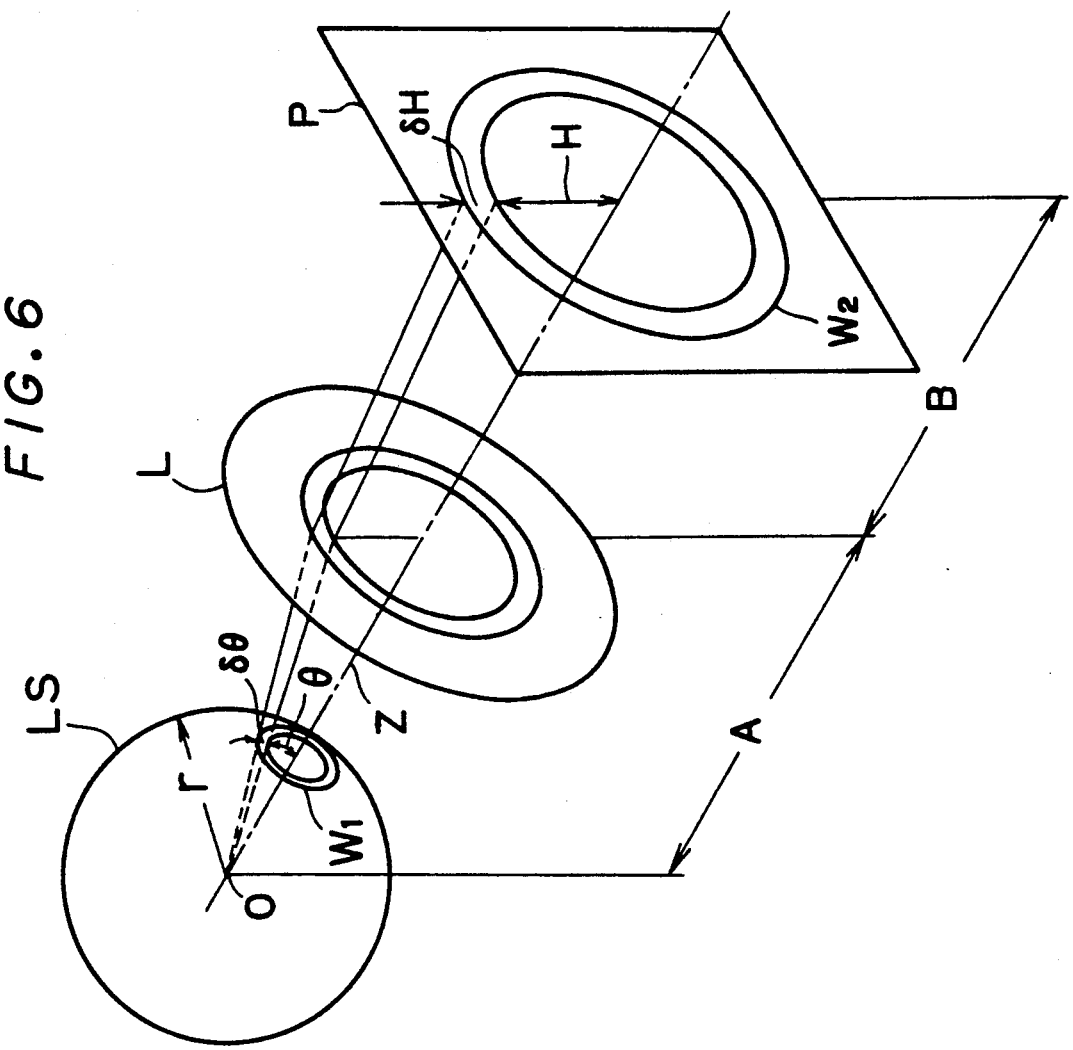
FIG. 6 is a perspective view schematically showing an optical lighting system using the lens optical system shown in FIG. 3.

FIG. 3 is a view showing an optical lens system according to an embodiment of an optical lighting system in accordance with the present invention. Referring to FIG. 3, an optical lens system L is placed between a light source LS and a surface P to be irradiated. Assuming a virtual sphere having a radius of r is located around the light source LS, as shown in FIG. 6, the area $\delta S_1$ of a circular band $W_1$ on the virtual sphere, inner and outer circles of which are defined by radial lines extending from the center O of the virtual sphere in angles $\theta$ and $\theta+\delta\theta$ with respect to an optical axis Z, respectively, is given by the following equation:

$$\delta S_1 = 2\pi r^2 \sin\theta\delta\theta... \quad (6)$$

A solid angle $\delta\Omega_1$ for viewing the circular band $W_1$ from the center O of the virtual sphere is $$\delta\Omega_1 = 2\pi \sin\theta\delta\theta... \quad (7)$$

and hence radiant flux F passing through the circular band $W_1$ is given by the following equation as the product of the solid angle $\delta\Omega_1$ and the radiant intensity $J(\theta)$:

$$F = J(\theta).2\pi \sin\theta\delta\theta... \quad (8)$$

Assuming that the radiant flux F irradiates a circular band $W_2$ on a surface P to be irradiated, and which has an outer radius H and $\delta$ H in width, through an optical lens system L, the area $\delta S_2$ of the circular band $W_2$ is $$\delta S_2 = 2\pi H\delta H... \quad (9)$$

and hence if the transmission factor of the optical lens system L is 100%, the illuminance S(H) of the circular band $W_2$ on the surface P to be irradiated is given by the following equation:

$$S(H) = J(\theta)\sin\theta\delta\theta/H\delta H... \quad (10)$$

The aforementioned equation (1) is obtained from the equation (10).

$$\int S(H) H dH = \int J(\theta) \sin \theta d\theta \quad \ldots \quad (1)$$

This equation (1) defines a relationship between an angle $\theta$, which a ray proceeding from the light source LS to the incident height $R_1$ of the optical lens system L makes with the optical axis Z and a irradiation height H.

In other words, equation (1) defines the exiting angle $\theta$ of a ray emitted from the light source LS, when irradiance S(H) on the surface P to be irradiated is set by a given function which satisfies $$S(H) \geq S(O) \ldots \quad (11)$$

for example, to unify irradiance all over the surface P to be irradiated in a contact or proximity exposure system, or to increase irradiance at the peripheral portion of the surface P to be irradiated to unify the irradiance of an image surface in a projection system.

It will be now described that a ray emitted from the light source LS in an outgoing angle $\theta$ can be led to a given irradiation height H by defining angles $\alpha_1$ and $\alpha_2$ which the light incident and exiting planes $F_1$ and $F_2$ of the optical lens system L make with the optical axis, respectively, by the aforementioned equations (2) and (3).

Figure 4:
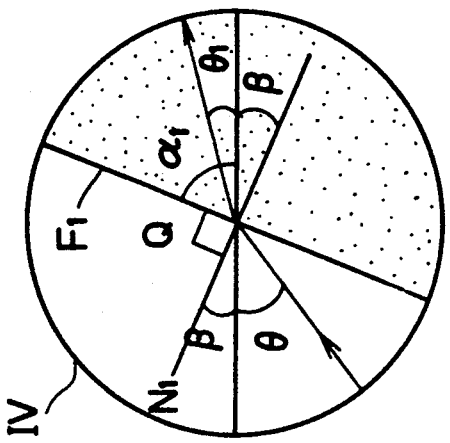
FIG. 4 and FIG. 5 are enlarged views showing the portions IV and V of FIG. 3, respectively.

Referring to FIG. 3, a ray emitted from the light source LS at outgoing angle $\theta$ reaches the point Q of an incident height $R_1$ on the light incident plane $F_1$ of the optical lens system L. FIG. 4 is an enlarged view showing the portion IV of FIG. 3. When the Snell's law is applied at the point Q in FIG. 4, the following equation results:

$$\sin(\theta + \beta) = n \sin(\beta + \theta_1) \quad (12)$$

$$\beta = 90° - \alpha_1 \quad (13)$$

where $\alpha_1$ is an angle which the light incident plane $F_1$ at the point Q makes with the optical axis Z, $\beta$ is an angle which a normal line $N_1$ dropped to the point Q makes with the optical axis Z, and $\theta_1$ is an angle which a ray refracted at the light incident plane $F_1$ makes with the optical axis Z.

The following equation is obtained by substituting equation (13) in the equation (12) and simplifying same:

$$\cos\theta \cos\alpha_1 + \sin\theta \sin\alpha_1 = n(\cos\theta_1 \cos\alpha_1 + \sin\theta_1 \sin\alpha_1) \quad (14)$$

The aforementioned equation (2) is obtained by dividing the both sides of the equation (14) by $\cos\alpha_1$ and simplifying the same:

$$\tan\alpha_1 = (-n\cos\theta_1 + \cos\theta)/(n\sin\theta_1 - \sin\theta) \ldots \quad (2)$$

Figure 5:
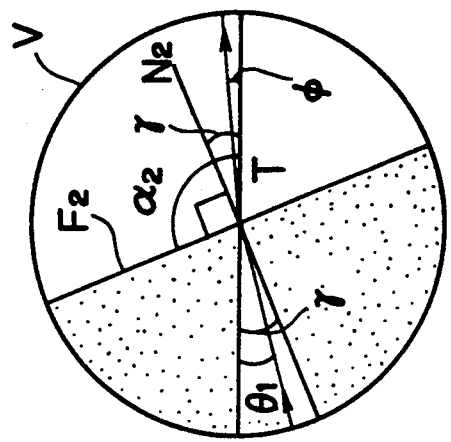

At the other side of lens L a ray refracted at the light exiting plane $F_2$ of the optical lens system L emerges from point T at outgoing height $R_2$ of the light exiting plane $F_2$. FIG. 5 is an enlarged view showing the portion V of FIG. 3. When Snell's law is applied at the point T in FIG. 5, the following equation results:

$$n \sin(\gamma - \theta_1) = \sin(\gamma - \phi) \ldots \quad (15)$$

$$\gamma = \alpha_2 - 90° \ldots \quad (16)$$

where $\alpha_2$ is an angle which the light exiting plane $F_2$ of outgoing at the point T makes with the optical axis Z, $\gamma$ is an angle which a normal line $N_2$ dropped to the point T makes with the optical axis Z, and $\phi$ is an angle which an exiting ray from the point T makes with the optical axis Z.

The aforementioned equation (3) is obtained by substituting the equation (16) in the equation (15):

$$\tan\alpha_2 = (-n\cos\theta_1 + \cos\theta)/(n\sin\theta_1 - \sin\theta) \ldots \quad (3)$$

According to the present invention, a ray emitted from the light source LS at an exiting angle reaches the irradiation height H and irradiates surface P in the desired irradiance S(H) satisfying the aforementioned equation (16), by defining the plane $F_1$ of incidence of the optical lens system L by the equation (2) and the light exiting plane $F_2$ by the equation (3), as is evident from the above description.

The embodiment where the optical lens system is constructed with a Fresnel lens will now be described. FIG. 7 is a view showing a Fresnel lens according to this second embodiment of the optical lighting system in accordance with the present invention. As shown in FIG. 7, a ray emitted from a light source LS at outgoing angle $\theta$ reaches the point Q of a incident height $R_1$ on the flat light incident plane $F_1$ of the Fresnel Lens FL. FIG. 8 is an enlarged view showing the portion VIII of FIG. 7. When Snell's law is applied at point Q in FIG. 8, the following equation results:

$$\sin\theta = n \sin\theta_1 \ldots \quad (17)$$

The equation (17) is rewritten into the following equation:

$$n \cos\theta_1 = \sqrt{n^2 - \sin^2\theta} \quad (18)$$

At the other side of Fresnel lens FL, a ray refracted at the light incident plane $F_1$ of the Fresnel lens FL emerges at the outgoing height $R_2$ of a Fresnel optical surface $F_s$, in FIG. 7. FIG. 9 is an enlarged view showing the portion IX of FIG. 7. When Snell's law is applied at the point T in FIG. 9, the aforementioned equation (3) is obtained:

$$\tan\alpha_2 = (-n\cos\theta_1 + \cos\phi)/(n\sin\theta_1 - \sin\theta) \ldots \quad (3)$$

The following equation is obtained by substituting the above equation (17) and (18) in the equation (3):

$$\tan\alpha_2 = (-\sqrt{n^2 - \sin^2\theta} + \cos\phi)/(\sin\theta - \sin\phi) \quad (19)$$

When the Fresnel lens is utilized, desired irradiance distribution similar to the optical lens system L as hereinbefore described can be obtained by forming the Fresnel optical surface $F_s$ in accordance with the equation (19).

The use of a Fresnel optical system FL to obtain uniform irradiance distribution on the surface P to be irradiated will now be described in more detail. Assuming that the irradiance S(H) on the surface P to be irradiated, which appears in the aforementioned equation (1), is defined as S(H)=S(0)=K (k: constant), the following equation is obtained:

$$\int K H dH = \int J(\theta) \sin \theta d\theta \ldots \quad (20)$$

When the radiant intensity of the light source LS is defined as $J(Q)=1$ (in the case of an ideal point light source), the following equations are obtained from equation (20):

$$(k/2)H^2 = 1 - \cos\theta = 2\sin^2(\theta/2) \ldots \quad (21)$$

$$\therefore H = (2/\sqrt{k}) \sin(\theta/2) \ldots \quad (22)$$

This equation (22) defines a relationship between an angle $\theta$, which is the angle a ray proceeding from the light source LS to the light incident plane $F_1$ of the Fresnel lens FL makes with an optical axis Z, and an irradiation height H. In a paraxial region, the irradiation height H defined by the above equation (22) is given by the following equation:

$$H = \theta(A + B - AB/f) \ldots \quad (23)$$

where A is a distance from the light source LS to the light incident plane $F_1$ of the Fresnel lens FL, B is a distance from the light exiting plane $F_2$ to the surface P to be irradiated on the optical axis Z of the Fresnel lens FL, and f is the focal length on the optical axis Z of the Fresnel lens FL.

The constant k is given by the following equation by using the equations (22) and (23):

$$K = 1/(A + B - AB/f)^2 \ldots \quad (24)$$

The following equation is obtained by substituting equation (24) in the equation (22):

$$H = 2(A + B - AB/F) \sin(\theta/2) \ldots \quad (25)$$

This equation (25) defines a relationship between the exiting angle $\theta$ from the light source LS and the irradiation height H, in the case where the distances A and B between the light source LS, the Fresnel lens FL and the surface P to be irradiated are appropriately defined and the surface P to be irradiated is irradiated in uniform irradiance by using a point light source.

That is, the configuration of the Fresnel lens FL is determined through the steps where first the incident height $R_1$ on the light incident plane $F_1$ is defined with respect to the exiting angle $\theta$ from the light source LS, secondly the outgoing height $R_2$ is defined on the assumption that the thickness D of the Fresnel lens FL is negligible, and thirdly the inclination angle $\alpha_2$ of the Fresnel optical surface $F_s$ at the exiting height $R_2$ is defined by the aforementioned equation (19).

Figure 10:
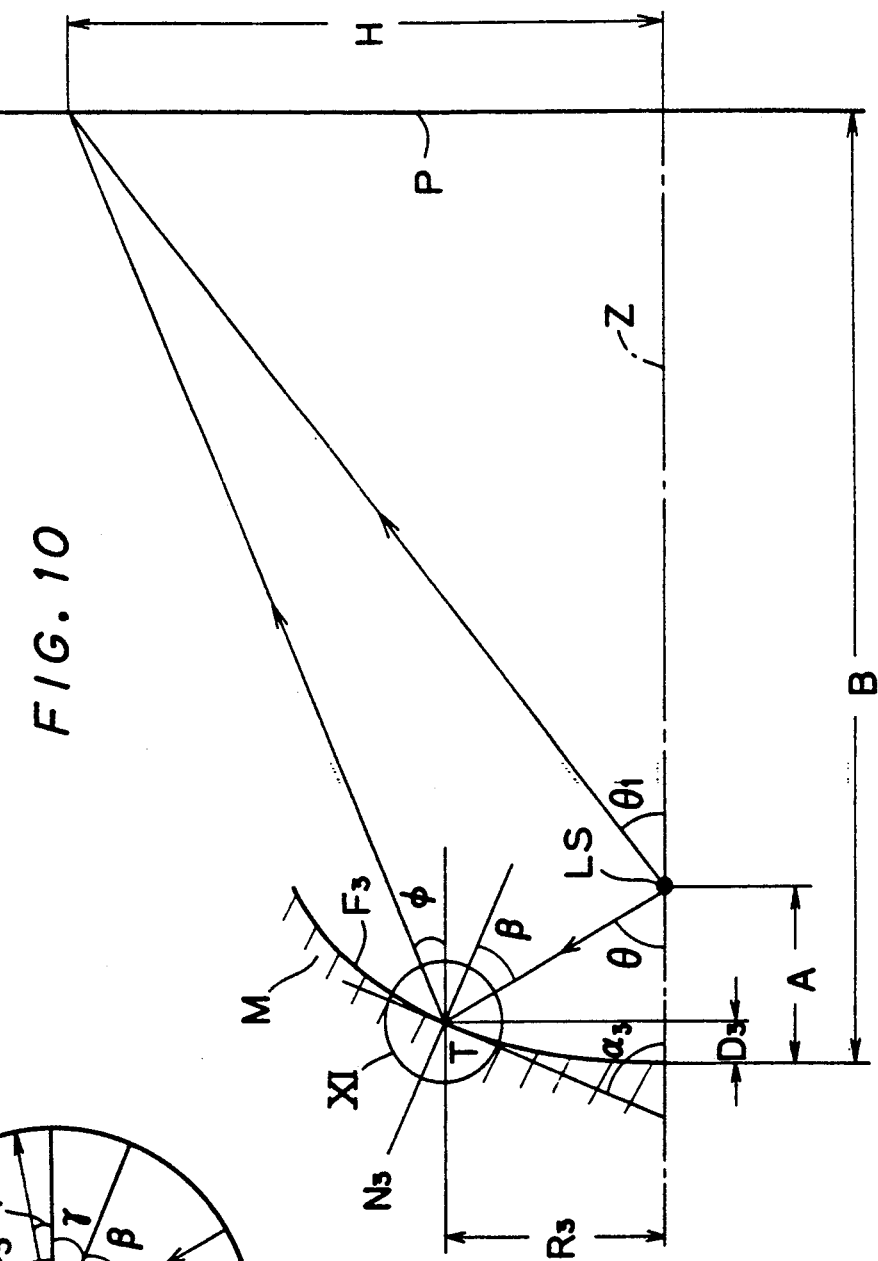
FIG. 10 is a view showing a optical mirror system according to still another embodiment of the optical lighting system in accordance with the present invention.

FIG. 10 is a view showing an optical mirror system according to a third embodiment of the optical lighting system in accordance with the present invention. In the case of an optical mirror system, the following equation can be applied in place of the equation (10) in the optical lens system as hereinbefore described:

$$S(H) = \{J(\theta_1) \sin \theta_1 \delta\theta_1\}/(H\delta H) + \{J(\theta) K(\beta) \sin \theta \delta\theta\}/(H\delta H) \quad (26)$$

In this equation (26), the first term of the right side corresponds to irradiance by direct light from a light source LS, and the second term of the right side corresponds to irradiance by reflection light which is generated by reflecting light emitted from the light source LS by an optical mirror system M. The first term is substantially negligible if the light source LS is a surface light source or the like which emits light only toward the optical mirror system M.

The aforementioned equation (4) is obtained from the above equation (26).

$$S(H)H\delta H = \int J(\theta_1) \sin \theta_1 \delta\theta_1 + \int J(\theta) K(\beta) \sin \theta \delta\theta \ldots \quad (4)$$

This equation (4) defines a relationship between an angle $\theta$, which is the angle a ray proceeding from the light source LS to the incident height $R_3$ of the mirror optical system M makes with an optical axis Z, and an irradiation height H.

That is, this equation shows that the optical mirror system M can be formed to obtained desired illuminance S(H) on a surface P to be irradiated as is similar to the case of the optical lens system L.

It will now be described that an angle $\alpha_3$, which a reflection surface $F_3$ at the incident height $R_3$ of the optical mirror system M makes with the optical axis Z is defined by the aforementioned equation (5).

Figure 11:
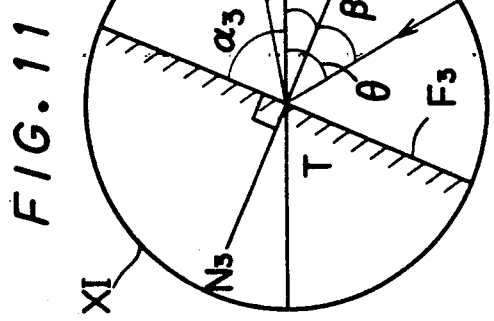
FIG. 11 is an enlarged view showing the portions XI of FIG. 10.

It is assumed that a ray emitted from the light source LS is an exiting angle $\theta$ irradiates the point T of the incident height $R_3$ on the reflection surface $F_3$ of the optical mirror system M. FIG. 11 is an enlarged view showing the portion XI of FIG. 10.

When the law of reflection is applied to the point T in FIG. 11, the following equation results:

$$\beta = \gamma + \phi \ldots \quad (27)$$

where, $\beta$ is an angle which an incident ray makes with a normal line $N_3$ dropped on the point T, $\gamma$ is an angle which the normal line $N_3$ makes with the optical axis Z, and $\phi$ is an angle which a reflected ray makes with the optical axis Z. The following equation defines the relationship between the angles $\beta$ and $\gamma$ $$\beta + \gamma = \theta \ldots \quad (28)$$

and the following equation defines the relationship between the angles $\gamma$ and $\alpha_3$:

$$\alpha_3 90° - \gamma \ldots \quad (29)$$

The following equation is obtained from the equations (27), (28) and (29):

$$\alpha_3 = 90° + (\phi - \theta)/2 \ldots \quad (30)$$

The aforementioned equation (5) is obtained by taking the tangent of the both sides of the equation (30):

$$\tan \alpha_3 = 1/\tan\{(\theta - \phi)/2\} \ldots \quad (5)$$

That is, the mirror optical system M can be implemented so as to provide desired irradiance S(H), similar to the case of the lens optical system L, by forming the reflection surface $F_3$ of the mirror optical system M in accordance with the equation (5).

Figure 12:
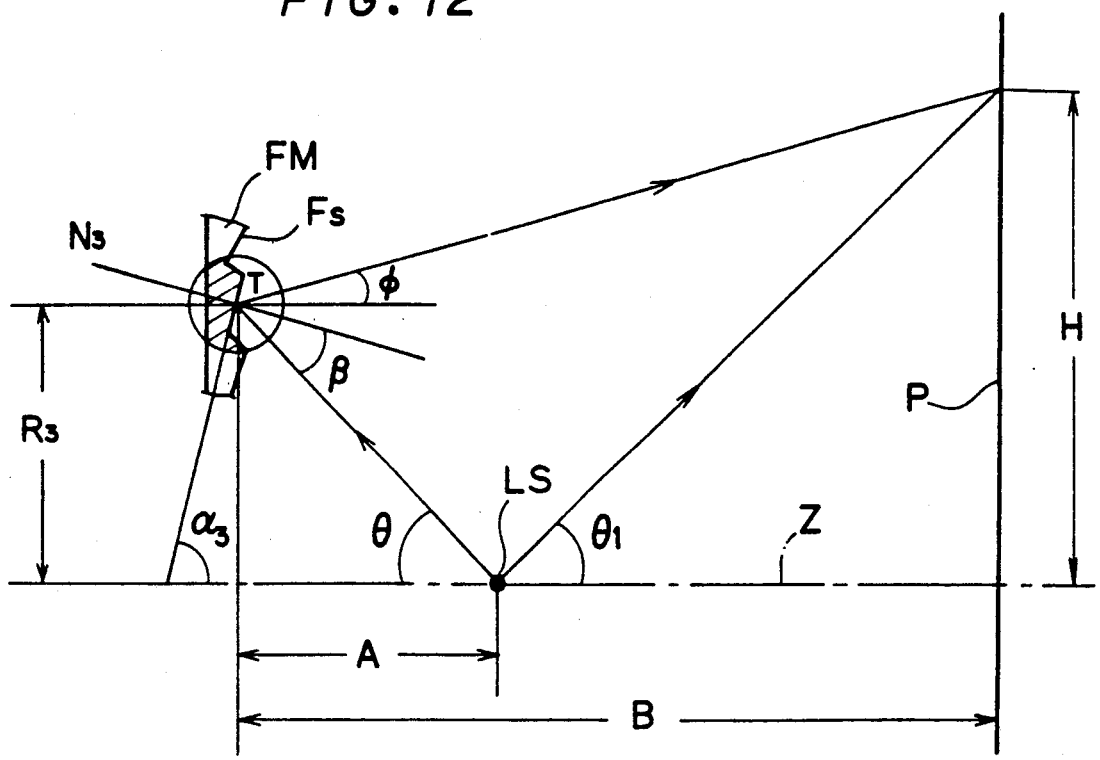
FIG. 12 is a view showing a Fresnel mirror according to still another embodiment of the optical lighting system in accordance with the present invention.

Further, it is evident that the same irradiance distribution as the mirror optical system M hereinbefore described can be obtained by using a Fresnel mirror FM, by forming a Fresnel optical surface $F_s$ in accordance with the aforementioned equation (5), as shown in FIG. 12.

Examples 1 to 27 which illustrate the present invention will now be discussed in accordance with the following classification wherein the examples are broadly classified into a lens optical system and a mirror optical system. These examples further illustrate the preferred embodiments within the scope of the present invention.

Lens Optical System
  (1) lens optical system including an aspheric surface lens ... L
    (i) for contact or proximity exposure ... L1
    (ii) for projection ... L2
  (2) lens optical system including a Fresnel lens ... LF
    (i) for contact or proximity exposure ... FL1
    (ii) for projection ... FL2

Mirror Optical System
  (1) mirror optical system including an aspheric surface mirror ... M
    (i) for contact or proximity exposure ... M1
    (ii) for projection ... M2
  (2) mirror optical system including a Fresnel mirror ... FM
    (i) for contact or proximity exposure ... FM1
    (ii) for projection ... FM2

Examples 1-27 will be illustrated by using the parameters as hereinafter described, lens or mirror data on the basis of parameter values and ray tracing views according to respective lens or mirror optical systems.

The various parameters are represented by the following symbols:

(A) In the case of a lens optical system (see FIG. 3 to FIG. 5)

A: distance between a light source LS and a plane $F_1$ of incidence

B: distance between an outgoing plane $F_2$ and a surface P to be irradiated

D: thickness of a lens L f: focal length of the lens optical system in a paraxial region n: refractive index of the lens L H: irradiation height on the surface P to be irradiated $\theta$: angle which an outgoing ray from the light source LS makes with an optical axis Z $\phi$: angle which an outgoing ray from the outgoing plane $F_2$ of the lens L makes with the optical axis Z $\alpha_2$: angle which the outgoing plane $F_2$ at an outgoing height $R_2$ makes with the optical axis Z $D_2$: sag at the outgoing height $R_2$, which is a distance between the foot of a perpendicular dropped to the optical axis Z from the outgoing plane $F_2$ at the outgoing height $R_2$ and the top of the outgoing plane $F_2$ E: efficiency factor for all radiant flux from the light source LS In these examples, the plane of incidence is formed using a spherical or flat surface, and hence values as to symbols $\alpha_1$, $R_1$ and $D_1$ in FIG. 3 are not shown.

(B) In the case of a mirror optical system (see FIG. 10 to FIG. 12)

A: distance between a light source LS and a reflecting surface $F_3$

B: distance between the reflecting $F_2$ and a surface P to be irradiated

H: irradiation height on the surface P to be irradiated $\theta$: angle which an outgoing ray from the light source LS makes with an optical axis Z $\phi$: angle which a reflected ray from the reflecting surface $F_3$ makes with the optical axis Z $\alpha_3$: angle which the reflecting surface $F_3$ makes with the optical axis Z $R_3$: reflective height of the reflected ray on the reflecting surface $F_3$ $D_3$: sag at the outgoing height $R_3$, which is a distance between the foot of a perpendicular dropped to the optical axis Z from the plane $F_3$ at the reflective height $R_3$ and the top of the reflecting surface $F_3$ E: efficiency factor for all radiant flux from the light source LS The reflection factor of each mirror optical system is adapted to satisfy $K(\beta)=0.9$.

Further it is assumed that radiant intensity distribution is uniform and hence $J(\theta)=1$ when the light source LS is a point light source, and $J(\theta)=\cos\theta$ is applied when the light source LS is a surface illuminant. In the following description, it is assumed that the size of the surface illuminated is negligible.

EXAMPLE 1

Figure 13:
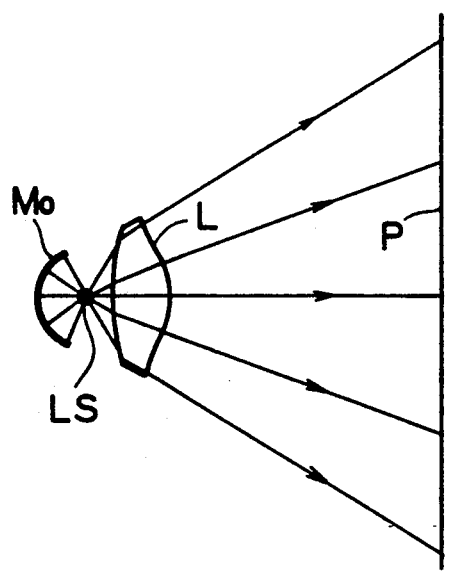
FIG. 13 to FIG. 39 are ray tracing views showing Examples 1-27 of the optical lighting system in accordance with the present invention, respectively.

In this example a lighting optical system comprising lens optical system L was used in a close contact or proximity exposure system in which irradiance on a surface P was uniform all over the surface P. The operating parameters and lens data are shown in Table 1 and a ray tracing view in accordance with this lens L is shown in FIG. 13.

In this example, the incidence plane $F_1$ of this lens L was a spherical surface when was convex toward a point light source LS and the outgoing plane $F_2$ thereof was an aspheric surface. In FIG. 13, the symbol $M_O$ denotes a spherical mirror for forward reflecting of a ray emitted backward from the point light source LS.

TABLE 1

| A = 30 mm | B = 600 mm | D = 80 mm | f = 200 mm | | |
|---|---|---|---|---|---|
| E = 55% | n = 1.5 | $R_1$ = 400 mm | | | |
| H (mm) | $\theta$ (deg) | $\phi$ (deg) | $\alpha_2$ (deg) | $R_2$ (mm) | $D_2$ (mm) |
| 25.0 | 3.0 | 1.9 | 92.0 | 4.3 | 0.0 |
| 50.0 | 6.1 | 3.9 | 94.1 | 8.7 | 0.3 |
| 75.0 | 9.2 | 5.8 | 96.1 | 13.1 | 0.6 |
| 100.0 | 12.4 | 7.8 | 98.1 | 17.5 | 1.2 |
| 125.0 | 15.5 | 9.7 | 100.2 | 21.9 | 1.9 |
| 150.0 | 18.6 | 11.6 | 102.2 | 26.2 | 2.8 |
| 175.0 | 21.7 | 13.4 | 104.2 | 30.6 | 3.8 |
| 200.0 | 24.9 | 15.2 | 106.2 | 34.9 | 5.0 |
| 225.0 | 28.1 | 17.0 | 108.2 | 39.2 | 6.3 |
| 250.0 | 31.3 | 18.7 | 110.2 | 43.5 | 7.8 |
| 275.0 | 34.5 | 20.4 | 112.1 | 47.8 | 9.5 |
| 300.0 | 37.8 | 22.0 | 113.8 | 52.2 | 11.3 |
| 325.0 | 41.1 | 23.6 | 115.5 | 56.5 | 13.3 |
| 350.0 | 44.4 | 25.1 | 116.9 | 61.0 | 15.5 |
| 375.0 | 47.8 | 26.5 | 118.1 | 65.7 | 17.9 |
| 400.0 | 51.2 | 27.9 | 118.8 | 70.6 | 20.6 |
| 425.0 | 54.6 | 29.2 | 119.0 | 76.0 | 23.6 |
| 450.0 | 58.1 | 30.3 | 118.4 | 82.3 | 27.1 |
| 475.0 | 62.7 | 31.3 | 116.3 | 90.6 | 31.4 |
| 500.0 | 65.3 | 31.8 | 111.1 | 103.8 | 37.2 |

EXAMPLE 2

Figure 14:
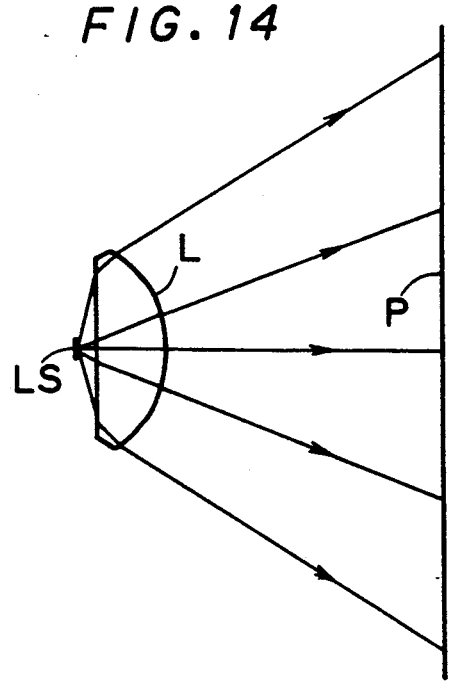

In this example an optical lighting system comprising an optical lens system L was used in a contact or proximity exposure system in which irradiance on a surface P to be irradiated was uniform all over the surface P. The operating parameters and lens data are shown in Table 2 and a ray tracing view in accordance with this lens L is shown in FIG. 14.

In this example, the incidence plane $F_1$ of lens L was a flat surface and the outgoing plane $F_2$ thereof was an aspheric surface. A light source LS is formed by a surface light source which emits light only toward the lens L.

TABLE 2

| A = 30 mm | B = 500 mm | D = 100 mm | f = 600 mm | |
|---|---|---|---|---|
| | E = 94% | n = 1.5 | | |
| H (mm) | $\theta$ (deg) | $\phi$ (deg) | $\alpha_2$ (deg) | $R_2$ (mm) | $D_2$ (mm) |
| 25.0 | 2.7 | 2.3 | 90.9 | 4.6 | 0.0 |
| 50.0 | 5.5 | 4.6 | 91.8 | 9.3 | 0.1 |
| 75.0 | 8.3 | 6.9 | 92.8 | 14.1 | 0.3 |
| 100.0 | 11.1 | 9.2 | 93.9 | 18.8 | 0.6 |
| 125.0 | 14.0 | 11.4 | 95.0 | 23.6 | 0.9 |
| 150.0 | 16.8 | 13.6 | 96.3 | 28.5 | 1.4 |
| 175.0 | 19.8 | 15.7 | 97.8 | 33.5 | 2.0 |
| 200.0 | 22.8 | 17.7 | 99.4 | 38.5 | 2.8 |
| 225.0 | 25.8 | 19.7 | 101.2 | 43.7 | 3.7 |
| 250.0 | 28.9 | 21.7 | 103.2 | 49.0 | 4.9 |
| 275.0 | 32.1 | 23.5 | 105.4 | 54.4 | 6.2 |
| 300.0 | 35.5 | 25.2 | 107.9 | 60.1 | 7.9 |
| 325.0 | 39.0 | 26.9 | 110.6 | 65.9 | 10.0 |
| 350.0 | 42.6 | 28.4 | 113.7 | 72.0 | 12.4 |
| 375.0 | 46.6 | 29.9 | 117.1 | 78.4 | 15.5 |
| 400.0 | 50.8 | 31.2 | 120.9 | 85.4 | 19.4 |
| 425.0 | 55.4 | 32.3 | 125.2 | 93.1 | 24.4 |
| 450.0 | 60.6 | 33.1 | 130.2 | 102.3 | 31.5 |
| 475.0 | 66.9 | 33.5 | 136.3 | 114.6 | 43.2 |
| 500.0 | 75.6 | 32.1 | 145.6 | 139.2 | 73.9 |

EXAMPLE 3

Figure 15:
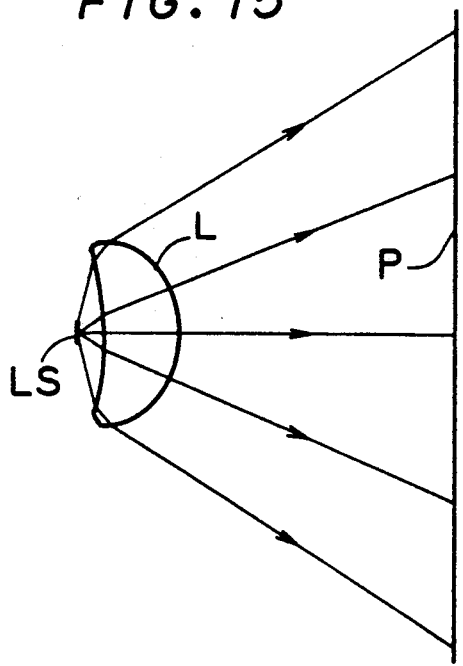

In this example an optical lighting system comprising an optical lens system L was used in a contact or proximity exposure system in which irradiance on a surface P to be irradiated was uniform all over the surface P. The operating parameters and lens data are shown in Table 3 and a ray tracing view in accordance with this lens L is shown in FIG. 15.

In this example, the incidence plane $F_1$ of this lens L was a spherical surface which was concave toward a light source LS and the outgoing plane $F_2$ thereof was an aspheric surface. The light source LS was formed by a surface light source which emits light only toward the lens L.

TABLE 3

| A = 40 mm | B = 500 mm | D = 100 mm | f = 900 mm | |
|---|---|---|---|---|
| | E = 94% | n = 1.5 | $R_1$ = −400 mm | |
| H (mm) | $\theta$ (deg) | $\phi$ (deg) | $\alpha_2$ (deg) | $R_2$ (mm) | $D_2$ (mm) |
| 25.0 | 2.7 | 2.2 | 91.3 | 5.3 | 0.0 |
| 50.0 | 5.5 | 4.4 | 92.7 | 10.6 | 0.2 |
| 75.0 | 8.3 | 6.7 | 94.1 | 16.0 | 0.5 |
| 100.0 | 11.1 | 8.9 | 95.7 | 21.5 | 1.0 |
| 125.0 | 14.0 | 11.0 | 97.3 | 26.9 | 1.6 |
| 150.0 | 16.9 | 13.1 | 99.1 | 32.5 | 2.4 |
| 175.0 | 19.8 | 15.2 | 101.0 | 38.1 | 3.4 |
| 200.0 | 22.8 | 17.1 | 103.2 | 43.8 | 4.6 |
| 225.0 | 25.8 | 19.0 | 105.6 | 49.7 | 6.1 |
| 250.0 | 29.0 | 20.9 | 108.3 | 55.6 | 8.0 |
| 275.0 | 32.2 | 22.6 | 111.3 | 61.7 | 10.1 |
| 300.0 | 35.6 | 24.3 | 114.7 | 68.0 | 12.8 |
| 325.0 | 39.1 | 25.8 | 118.5 | 74.4 | 16.0 |
| 350.0 | 42.8 | 27.3 | 122.8 | 81.0 | 19.9 |
| 375.0 | 46.7 | 28.6 | 127.7 | 87.9 | 24.8 |
| 400.0 | 50.9 | 29.8 | 133.3 | 95.0 | 30.9 |
| 425.0 | 55.5 | 30.8 | 139.8 | 102.5 | 38.7 |
| 450.0 | 60.8 | 31.7 | 147.5 | 110.4 | 49.5 |
| 475.0 | 67.2 | 32.1 | 157.3 | 118.8 | 65.6 |
| 500.0 | 76.0 | 32.0 | 171.0 | 127.2 | 95.7 |

EXAMPLE 4

Figure 16:
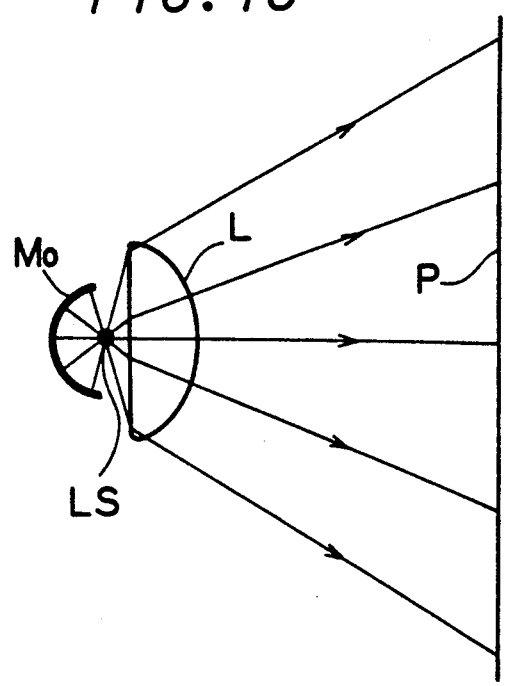

In this example an optical lighting system comprising an optical lens system L was used in a projection system in which irradiance on a surface P to be irradiated was higher in the peripheral portion of the surface P. The operating parameters and lens data are shown in Table 4 and a ray tracing view in accordance with lens L is shown in FIG. 16.

In this example, the incidence plane $F_1$ of this lens L was a flat surface and the outgoing plane $F_2$ thereof was an aspheric surface. A spherical mirror $M_O$ was placed in the rear of a point light surface LS.

In this example, it is assumed that the effective half field angle of an image-formation lens (not shown) is 26.6°, and relative irradiance on the surface P to be irradiated is set as shown in Table 4 to unify the irradiance of an image surface.

TABLE 4

| A = 40 mm | B = 500 mm | D = 100 mm | | | |
|---|---|---|---|---|---|
| | f = 400 mm | E = 67% | n = 1.5 | | |
| H (mm) | $\theta$ (deg) | $\phi$ (deg) | $\alpha_2$ (deg) | $R_2$ (mm) | $D_2$ (mm) | relative irradiated |
| 25.0 | 3.0 | 2.2 | 91.6 | 5.6 | 0.0 | 1.00 |
| 50.0 | 6.0 | 4.4 | 93.3 | 11.2 | 0.3 | 1.00 |
| 75.0 | 9.1 | 6.6 | 95.0 | 16.9 | 0.7 | 1.01 |
| 100.0 | 12.1 | 8.7 | 96.7 | 22.6 | 1.3 | 1.01 |
| 125.0 | 15.2 | 10.8 | 98.6 | 28.4 | 2.0 | 1.03 |
| 150.0 | 18.4 | 12.9 | 100.6 | 34.2 | 3.0 | 1.04 |
| 175.0 | 21.6 | 14.9 | 102.7 | 40.1 | 4.2 | 1.06 |
| 200.0 | 24.8 | 16.9 | 105.0 | 46.1 | 5.7 | 1.08 |
| 225.0 | 28.2 | 18.8 | 107.5 | 52.1 | 7.5 | 1.10 |
| 250.0 | 31.6 | 20.6 | 110.1 | 58.3 | 9.6 | 1.12 |
| 275.0 | 35.1 | 22.3 | 113.0 | 64.5 | 12.1 | 1.15 |
| 300.0 | 38.6 | 23.9 | 115.9 | 70.9 | 15.0 | 1.18 |
| 325.0 | 42.3 | 25.5 | 119.1 | 77.5 | 18.4 | 1.22 |
| 350.0 | 46.2 | 26.9 | 122.2 | 84.3 | 22.4 | 1.26 |
| 375.0 | 50.2 | 28.2 | 125.9 | 91.4 | 27.2 | 1.30 |
| 400.0 | 54.3 | 29.4 | 129.4 | 98.9 | 33.0 | 1.34 |
| 425.0 | 58.6 | 30.4 | 133.1 | 107.1 | 40.2 | 1.39 |
| 450.0 | 63.2 | 31.2 | 136.9 | 116.5 | 49.7 | 1.44 |
| 475.0 | 68.0 | 31.6 | 140.9 | 128.1 | 63.0 | 1.50 |
| 500.0 | 73.0 | 31.3 | 145.4 | 144.2 | 84.6 | 1.56 |

EXAMPLE 5

Figure 17:
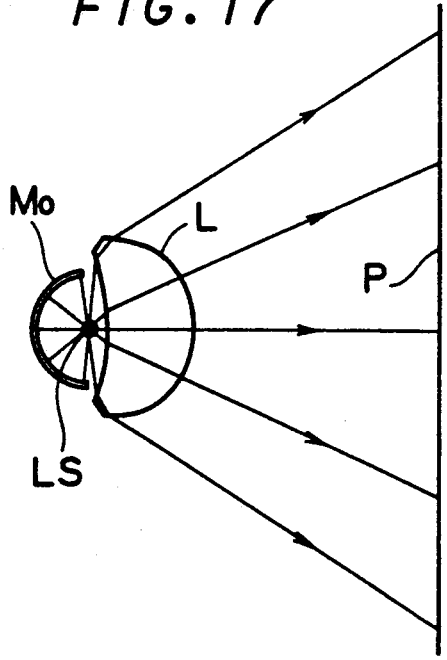

In this example an optical lighting system comprising an optical lens system L was used in a projection system in which irradiance on a surface P to be irradiated was higher in the peripheral portion of the surface P. The operating parameters and lens data are shown in Table 5 and a ray tracing view in accordance with lens L is shown in FIG. 17.

In this example, the incidence plane $F_1$ of lens L was a spherical surface which is concave toward a point light source LS and the outgoing plane $F_2$ thereof was an aspheric surface. A spherical mirror $M_O$ is placed in the rear of a point light surface LS.

Also in this example, relative irradiance on the surface P to be irradiated is as shown in Table 5 to unify the irradiance of an image surface, as is similar to example 4.

TABLE 5

| A = 30 mm | B = 400 mm | D = 150 mm | f = 700 mm | | |
|---|---|---|---|---|---|
| | E = 85% | n = 1.5 | $R_1$ = −400 mm | | |
| H (mm) | $\theta$ (deg) | $\phi$ (deg) | $\alpha_2$ (deg) | $R_2$ (mm) | $D_2$ (mm) | relative irradiated |
| 25.0 | 3.4 | 2.4 | 92.2 | 7.9 | 0.1 | 1.00 |
| 50.0 | 6.8 | 4.8 | 94.4 | 15.8 | 0.6 | 1.00 |
| 75.0 | 10.2 | 7.2 | 96.7 | 23.8 | 1.3 | 1.01 |
| 100.0 | 13.6 | 9.6 | 99.1 | 31.8 | 2.4 | 1.02 |
| 125.0 | 17.1 | 11.9 | 101.7 | 39.8 | 3.9 | 1.03 |
| 150.0 | 20.7 | 14.1 | 104.5 | 47.9 | 5.8 | 1.04 |
| 175.0 | 24.3 | 16.2 | 107.5 | 55.9 | 8.1 | 1.06 |
| 200.0 | 28.0 | 18.3 | 110.7 | 64.0 | 10.9 | 1.08 |
| 225.0 | 31.7 | 20.2 | 114.2 | 72.1 | 14.2 | 1.10 |
| 250.0 | 35.6 | 22.0 | 118.0 | 80.2 | 18.2 | 1.12 |
| 275.0 | 39.5 | 23.8 | 122.2 | 88.2 | 22.8 | 1.15 |
| 300.0 | 43.6 | 25.4 | 126.6 | 96.2 | 28.3 | 1.18 |

TABLE 5-continued

| | A = 30 mm | B = 400 mm | D = 150 mm | f = 700 mm | |
| | E = 85% | n = 1.5 | $R_1$ = −400 mm | | |
| H (mm) | $\theta$ (deg) | $\phi$ (deg) | $\alpha_2$ (deg) | $R_2$ (mm) | $D_2$ (mm) | relative irradiated |
|---|---|---|---|---|---|---|
| 325.0 | 47.9 | 26.9 | 131.4 | 104.1 | 34.7 | 1.22 |
| 350.0 | 52.3 | 28.3 | 136.5 | 111.8 | 42.1 | 1.26 |
| 375.0 | 56.9 | 29.5 | 142.0 | 119.5 | 51.0 | 1.30 |
| 400.0 | 61.7 | 30.6 | 147.8 | 126.9 | 61.6 | 1.34 |
| 425.0 | 66.8 | 31.4 | 154.2 | 134.1 | 74.7 | 1.39 |
| 450.0 | 72.1 | 32.1 | 161.3 | 141.0 | 91.4 | 1.44 |
| 475.0 | 77.8 | 32.5 | 169.2 | 146.8 | 113.7 | 1.50 |
| 500.0 | 83.9 | 32.7 | 178.2 | 150.2 | 144.4 | 1.56 |

EXAMPLE 6

Figure 18:
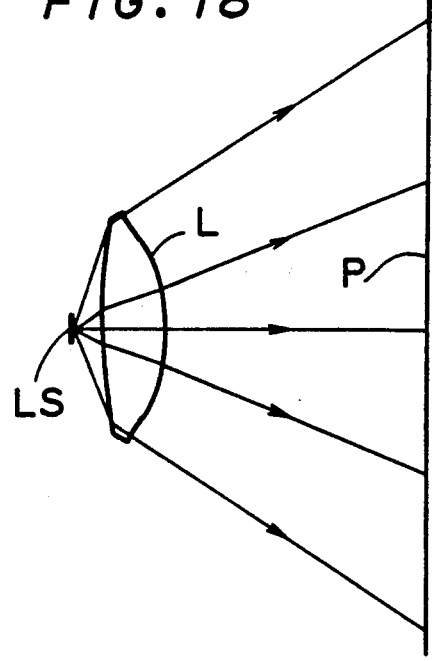

In this example an optical lighting system comprising a lens optical system L was used in a projection system in which irradiance on a surface P to be irradiated was higher in the peripheral portion of the surface P. The operating parameters and lens data are shown in Table 6 and a ray tracing view in accordance with lens L is shown in FIG. 18.

In this example, the incidence plane $F_1$ of lens L was a spherical surface which is convex toward a point light source LS and the outgoing plane $F_2$ of outgoing thereof was an aspheric surface. The light source LS was a surface light source which emits light only toward the lens L.

Also in this example, relative irradiance on the surface P to be irradiated is as shown in Table 6, as is similar to example 4.

TABLE 6

| | A = 25 mm | B = 600 mm | D = 50 mm | f = 500 mm | |
| | E = 87% | n = 1.5 | $R_1$ = 600 mm | | |
| H (mm) | $\theta$ (deg) | $\phi$ (deg) | $\alpha_2$ (deg) | $R_2$ (mm) | $D_2$ (mm) | relative irradiated |
|---|---|---|---|---|---|---|
| 25.0 | 2.3 | 2.1 | 90.3 | 2.3 | 0.0 | 1.00 |
| 50.0 | 4.7 | 4.3 | 90.7 | 4.7 | 0.0 | 1.00 |
| 75.0 | 7.1 | 6.4 | 91.1 | 7.2 | 0.0 | 1.01 |
| 100.0 | 9.5 | 8.5 | 91.6 | 9.6 | 0.1 | 1.02 |
| 125.0 | 12.0 | 10.6 | 92.2 | 12.1 | 0.2 | 1.03 |
| 150.0 | 14.5 | 12.6 | 92.9 | 14.7 | 0.3 | 1.04 |
| 175.0 | 17.1 | 14.7 | 93.8 | 17.3 | 0.4 | 1.06 |
| 200.0 | 19.7 | 16.6 | 94.9 | 20.1 | 0.6 | 1.08 |
| 225.0 | 22.4 | 18.5 | 96.1 | 22.9 | 0.9 | 1.10 |
| 250.0 | 25.2 | 20.4 | 97.6 | 25.9 | 1.3 | 1.12 |
| 275.0 | 28.2 | 22.2 | 99.3 | 29.0 | 1.7 | 1.15 |
| 300.0 | 31.3 | 23.9 | 101.2 | 32.2 | 2.3 | 1.18 |
| 325.0 | 34.5 | 25.6 | 103.5 | 35.7 | 3.1 | 1.22 |
| 350.0 | 38.0 | 27.2 | 105.9 | 39.5 | 4.1 | 1.26 |
| 375.0 | 41.7 | 28.6 | 108.7 | 43.6 | 5.3 | 1.30 |
| 400.0 | 45.7 | 30.0 | 111.8 | 48.1 | 7.0 | 1.34 |
| 425.0 | 50.2 | 31.3 | 115.1 | 53.3 | 9.3 | 1.39 |
| 450.0 | 55.2 | 32.4 | 118.6 | 59.7 | 12.5 | 1.44 |
| 475.0 | 61.3 | 33.3 | 121.8 | 68.7 | 17.8 | 1.50 |
| 500.0 | 69.0 | 33.1 | 122.3 | 88.1 | 30.2 | 1.56 |

EXAMPLE 7

Figure 19:
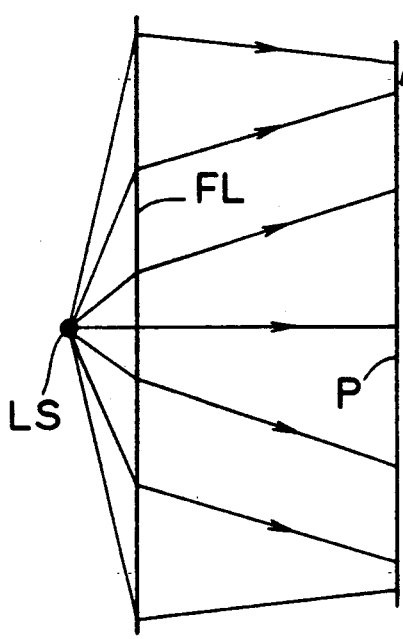

In this example an optical lighting system comprising a Fresnel lens FL was used in a contact or proximity exposure system in which irradiance on a surface P to be irradiated was uniform all over the surface P. The operating parameters and lens data are shown in Table 7 and a ray tracing view in accordance with this Fresnel lens FL is shown in FIG. 19.

The light source LS was a point light source.

TABLE 7

| A = 125 mm | B = 500 mm | f = 278 mm | n = 1.491 | |
|---|---|---|---|---|
| $R_2$ (mm) | $\alpha_2$ (deg) | $\theta$ (deg) | $\phi$ (deg) | H (mm) |
| 10 | 94.2 | 4.6 | 2.5 | 31.9 |
| 20 | 98.4 | 9.1 | 5.0 | 63.4 |
| 40 | 106.5 | 17.7 | 9.5 | 123.4 |
| 60 | 114.2 | 25.6 | 13.2 | 177.6 |
| 80 | 121.3 | 32.6 | 16.2 | 224.8 |
| 100 | 127.6 | 38.7 | 18.3 | 264.9 |
| 125 | 134.5 | 45.0 | 19.9 | 306.3 |
| 150 | 140.4 | 50.2 | 20.8 | 339.5 |
| 200 | 149.7 | 58.0 | 20.6 | 388.0 |
| 250 | 156.6 | 63.4 | 18.9 | 420.8 |
| 300 | 162.0 | 67.4 | 16.1 | 440.0 |
| 350 | 166.1 | 70.4 | 12.5 | 461.0 |
| 400 | 169.0 | 72.7 | 8.4 | 474.1 |
| 500 | 172.3 | 76.0 | −0.9 | 492.6 |
| 560 | 173.0 | 77.4 | −6.8 | 500.5 |

EXAMPLE 8

Figure 20:
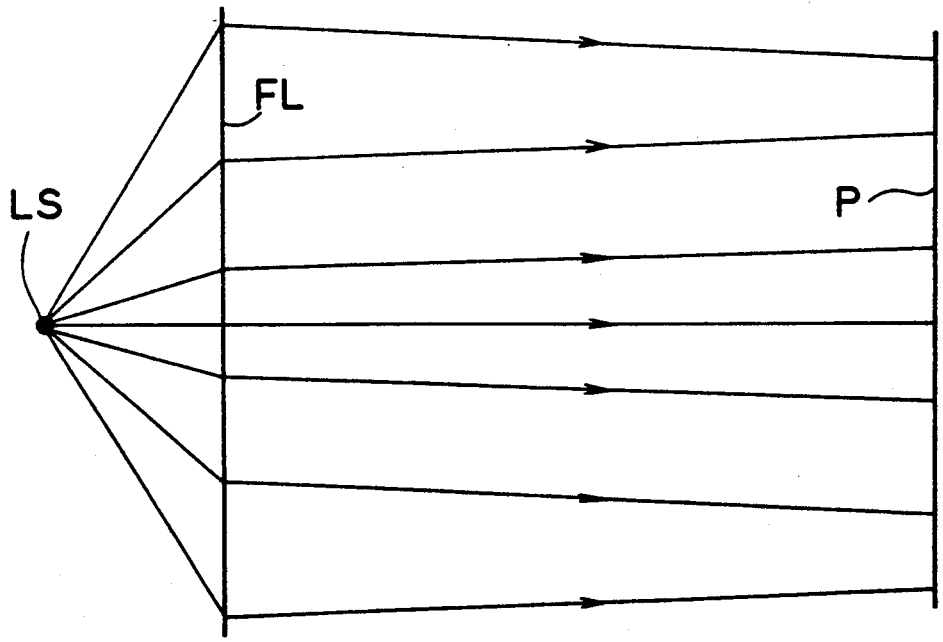

In this example an optical lighting system comprising a Fresnel lens FL was used in a contact or proximity exposure system in which irradiance on a surface P to be irradiated is uniform all over the surface P. The operating parameters and lens data are shown in Table 8 and a ray tracing view in accordance with this Fresnel lens FL is shown in FIG. 20.

In this example, parameters values A, B and f were selected so that an outgoing angle $\phi$ from the Fresnel lens FL had a small angle, approximately parallel light.

According to this example, a declination angle on the surface P was within 3° and hence the surface P can be irradiated by light which is almost parallel light, although the optical path length becomes longer than that in example 17 hereinafter described. Therefore, a small gap between a pattern original and a photosensitive material, will not result in lowering of resolution or misregistration. The light source LS was a point light source.

TABLE 8

| A = 340 mm | B = 1360 mm | f = 389 mm | n = 1.491 | |
|---|---|---|---|---|
| $R_2$ (mm) | $\alpha_2$ (deg) | $\theta$ (deg) | $\phi$ (deg) | H (mm) |
| 25 | 97.5 | 4.2 | 0.5 | 37.5 |
| 50 | 104.7 | 8.4 | 1.0 | 74.6 |
| 75 | 111.7 | 12.4 | 1.5 | 110.8 |
| 100 | 118.1 | 16.4 | 1.9 | 145.8 |
| 125 | 124.1 | 20.2 | 2.3 | 179.2 |
| 150 | 129.4 | 23.8 | 2.6 | 210.9 |
| 175 | 134.2 | 27.2 | 2.8 | 240.8 |
| 200 | 138.5 | 30.5 | 2.9 | 268.7 |
| 250 | 145.7 | 36.3 | 2.9 | 318.8 |
| 300 | 151.3 | 41.4 | 2.6 | 361.7 |
| 400 | 159.2 | 49.6 | 1.2 | 429.2 |
| 500 | 164.0 | 55.8 | −0.9 | 478.4 |
| 556 | 166.0 | 58.6 | −2.4 | 500.1 |

EXAMPLE 9

Figure 21:
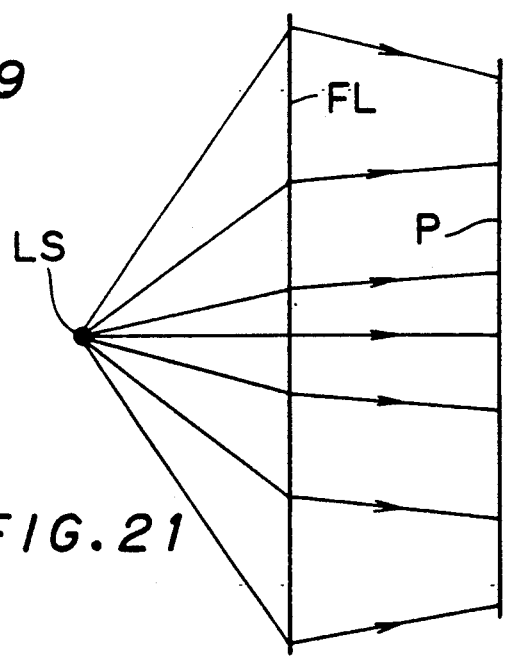

In this example an optical lighting system comprising a Fresnel lens FL was used in a contact or proximity exposure system in which irradiance on a surface P to be irradiated was uniform all over the surface P. The operating parameters and lens data are shown in Table 9 and a ray tracing view in accordance with this Fresnel lens FL is shown in FIG. 21.

This example is useful when the Fresnel lens FL must be kept away from a light source LS to prevent deleterious effects due to heat from light source LS.

According to this example, the declination angle was relatively small, for example 12.8°, the optical path length was small, for example 800 mm, while a 1000 mm effective area was uniformly irradiated. The light source LS was a point light source.

TABLE 9

| A = 400 mm | B = 400 mm | f = 600 mm | n = 1.491 | |
|---|---|---|---|---|
| $R_2$ (mm) | $\alpha_2$ (deg) | $\theta$ (deg) | $\phi$ (deg) | H (mm) |
| 25 | 94.9 | 3.6 | 1.2 | 33.3 |
| 50 | 99.7 | 7.1 | 2.3 | 66.3 |
| 75 | 104.6 | 10.6 | 3.4 | 98.7 |
| 100 | 109.4 | 14.0 | 4.3 | 130.3 |
| 150 | 118.9 | 20.6 | 5.8 | 190.3 |
| 200 | 128.0 | 26.6 | 6.4 | 245.1 |
| 250 | 136.5 | 32.0 | 6.3 | 294.1 |
| 300 | 143.9 | 36.9 | 5.3 | 337.3 |
| 350 | 150.3 | 41.2 | 3.6 | 375.2 |
| 400 | 155.5 | 45.0 | 1.2 | 408.2 |
| 500 | 162.6 | 51.3 | −5.4 | 462.1 |
| 591 | 165.8 | 55.9 | −12.8 | 500.0 |

EXAMPLE 10

Figure 22:
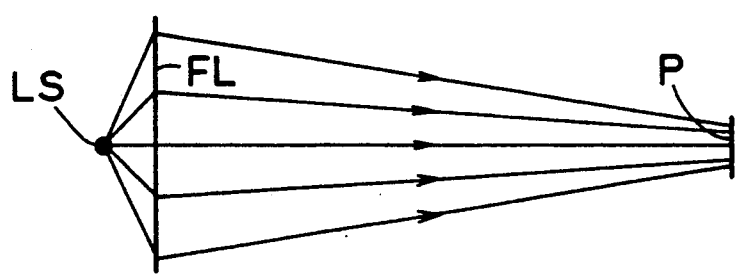

In this example an optical lighting system comprising a Fresnel lens FL was used in a contact or proximity exposure system in which irradiance on a surface P to be irradiated was uniform all over the surface P. The operating parameters and lens data are shown in Table 10 and a ray tracing view in accordance with this Fresnel lens FL is shown in FIG. 22.

In this example, the diameter of the area which was irradiated was set at 7.78 mm, and the distance B of the gap between the Fresnel lens FL and the surface P to be irradiated was set at 100 mm. This example is useful when irradiating a relatively small area from relatively far away. The light source LS was a point light source.

TABLE 10

| A = 10 mm | B = 100 mm | f = 9.4 mm | n = 1.491 | |
|---|---|---|---|---|
| $R_2$ (mm) | $\alpha_2$ (deg) | $\theta$ (deg) | $\phi$ (deg) | H (mm) |
| 0.5 | 96.2 | 2.9 | −0.2 | 0.18 |
| 1.0 | 102.2 | 5.7 | −0.4 | 0.36 |
| 1.5 | 108.1 | 8.5 | −0.6 | 0.54 |
| 2.0 | 113.6 | 11.3 | −0.7 | 0.71 |
| 3.0 | 123.5 | 16.7 | −1.1 | 1.05 |
| 4.0 | 131.8 | 21.8 | −1.5 | 1.37 |
| 6.0 | 144.2 | 31.0 | −2.3 | 1.93 |
| 8.0 | 152.4 | 38.7 | −3.2 | 2.40 |
| 10.0 | 158.0 | 45.0 | −4.1 | 2.77 |
| 12.5 | 162.6 | 51.3 | −5.4 | 3.13 |
| 15.0 | 165.6 | 56.3 | −6.6 | 3.41 |
| 17.5 | 167.6 | 60.3 | −7.9 | 3.63 |
| 20.0 | 169.0 | 63.4 | −9.2 | 3.80 |
| 21.5 | 169.6 | 65.1 | −10.0 | 3.89 |

EXAMPLE 11

Figure 23:
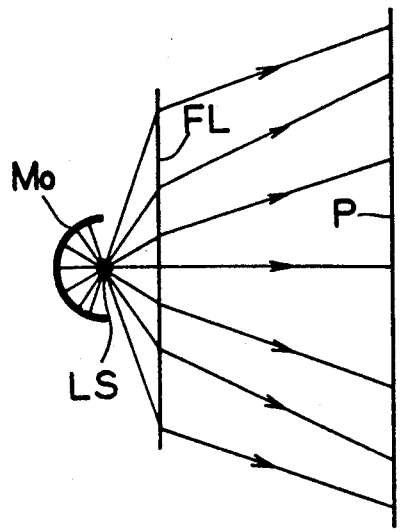

In this example an optical lighting system comprising a Fresnel lens FL was used in a contact or proximity exposure system in which irradiance on a surface P to be irradiated was uniform all over the surface P. The operating parameters and lens data are shown in Table 11 and a ray tracing view in accordance with this Fresnel lens FL is shown in FIG. 23.

In this example, a spherical mirror $M_O$ was placed in the rear of a point light source LS.

TABLE 11

| A = 120 mm | B = 480 mm | f = 350 mm | | |
|---|---|---|---|---|
| E = 63% | n = 1.5 | | | |
| H (mm) | $\theta$ (deg) | $\phi$ (deg) | $\alpha_2$ (deg) | $R_2$ (mm) |
| 25 | 3.2 | 2.1 | 92.3 | 6.8 |
| 50 | 6.5 | 4.3 | 94.5 | 13.8 |
| 75 | 9.8 | 6.4 | 96.8 | 20.9 |
| 100 | 13.1 | 8.5 | 99.2 | 28.1 |
| 125 | 16.5 | 10.5 | 101.6 | 35.5 |
| 150 | 19.8 | 12.5 | 104.2 | 43.2 |
| 175 | 23.1 | 14.4 | 106.8 | 51.3 |
| 200 | 26.5 | 16.2 | 109.5 | 59.9 |
| 225 | 29.9 | 17.9 | 112.3 | 69.1 |
| 250 | 33.3 | 19.6 | 115.3 | 79.0 |
| 275 | 36.8 | 21.0 | 118.4 | 89.8 |
| 300 | 40.3 | 22.4 | 121.7 | 101.7 |
| 325 | 43.8 | 23.6 | 125.2 | 115.1 |
| 350 | 47.3 | 24.5 | 128.8 | 130.4 |
| 375 | 51.0 | 25.2 | 132.8 | 148.2 |
| 400 | 54.6 | 25.6 | 137.0 | 169.3 |
| 425 | 58.4 | 25.5 | 141.6 | 195.2 |
| 450 | 62.2 | 24.8 | 146.8 | 227.8 |
| 475 | 66.1 | 23.0 | 152.8 | 270.9 |
| 500 | 70.0 | 19.3 | 159.7 | 331.1 |

EXAMPLE 12

Figure 24:
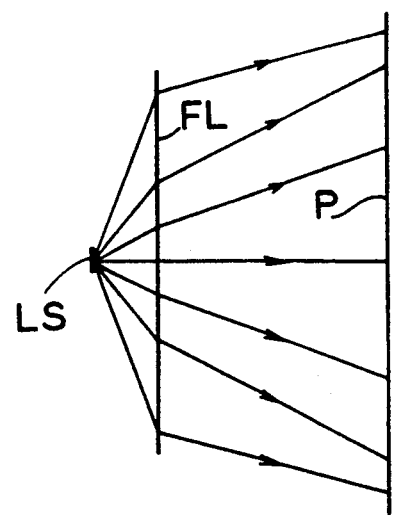

In this example an optical lighting system comprising a Fresnel lens FL was used in a contact or proximity exposure system in which irradiance on a surface P to be irradiated was uniform all over the surface P. The operating parameters and lens data are shown in Table 12 and a ray tracing view in accordance with this Fresnel lens FL is shown in FIG. 24.

In this example, a light source LS was formed by a surface light source which emits light only toward the Fresnel lens FL.

TABLE 12

| A = 130 mm | B = 500 mm | f = 650 mm | | |
|---|---|---|---|---|
| E = 89% | n = 1.5 | | | |
| H (mm) | $\theta$ (deg) | $\phi$ (deg) | $\alpha_2$ (deg) | $R_2$ (mm) |
| 25 | 2.7 | 2.1 | 91.1 | 6.1 |
| 50 | 5.4 | 4.3 | 92.2 | 12.3 |
| 75 | 8.1 | 6.4 | 93.4 | 18.5 |
| 100 | 10.8 | 8.5 | 94.6 | 24.9 |
| 125 | 13.6 | 10.5 | 96.0 | 31.5 |
| 150 | 16.4 | 12.5 | 97.5 | 38.3 |
| 175 | 19.2 | 14.5 | 99.1 | 45.4 |
| 200 | 22.1 | 16.3 | 100.9 | 52.9 |
| 225 | 25.1 | 18.1 | 103.0 | 60.9 |
| 250 | 28.1 | 19.8 | 105.3 | 69.5 |
| 275 | 31.2 | 21.4 | 107.9 | 78.9 |
| 300 | 34.4 | 22.8 | 110.8 | 89.2 |
| 325 | 37.8 | 24.1 | 114.1 | 100.9 |
| 350 | 41.3 | 25.2 | 117.9 | 114.3 |
| 375 | 45.0 | 26.0 | 122.2 | 130.1 |
| 400 | 49.0 | 26.6 | 127.3 | 149.5 |
| 425 | 53.3 | 26.6 | 133.4 | 174.4 |
| 450 | 58.1 | 25.7 | 141.0 | 208.9 |
| 475 | 63.6 | 23.0 | 150.8 | 262.6 |
| 500 | 70.6 | 14.5 | 164.0 | 369.7 |

EXAMPLE 13

In this example, the declination angle on surface P to be irradiated was reduced to 0° by placing a second Fresnel lens $FL_2$ in the rear of a first Fresnel lens $FL_1$. This example is useful for a proximity exposure device or the like which needs high accuracy in pattern printing size.

Figure 25:
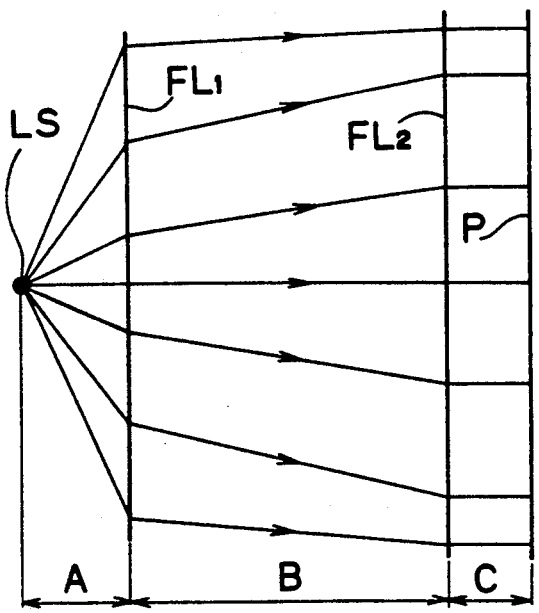

The operating conditions and Fresnel lens data are shown in Table 13 and a ray tracing view in accordance with these Fresnel lenses $FL_1$ and $FL_2$ is shown in FIG. 25.

In Table 13, B was the gap between the first and second Fresnel lenses $FL_1$ and $FL_2$, n' was the refractive index of the second Fresnel lens $FL_2$, $\alpha'$ was an angle which the Fresnel optical surface of the second Fresnel lens $FL_2$ made with an optical axis, and $\phi'$ was a declination angle on the surface P to be irradiated, which corresponds to an outgoing angle from the second Fresnel lens $FL_2$.

In this example, the plane of incidence of the second Fresnel lens $FL_2$ was uniformly irradiated by the first Fresnel lens $FL_1$, and parallel light was emitted by the second Fresnel lens $FL_2$. The luminous flux density of this parallel light can be kept at a constant value even if a gap C between the second Fresnel lens $FL_2$ and the surface P to be irradiated varies, and hence the gap C can be arbitrarily selected.

According to this example, therefore, an area to be irradiated, which was 1000 mm in diameter, can be uniformly irradiated all over the area while setting an optical path length at a small value (841 mm+C). Thus, high accuracy pattern printing can be ensured. The light source LS was a point light source.

TABLE 13

| A = 210 mm | B = 631 mm | f = 350 mm | | n = n' = 1.491 | |
|---|---|---|---|---|---|
| R (mm) | $\alpha_2$ (deg) | $\theta$ (deg) | $\phi$ (deg) | H (mm) | $\alpha'$ (deg) | $\phi'$ (deg) |
| 46 | 105.1 | 12.4 | 4.9 | 99.5 | 99.8 | 0 |
| 92 | 119.0 | 23.7 | 8.8 | 189.6 | 107.5 | 0 |
| 138 | 130.9 | 33.3 | 11.4 | 265.1 | 112.4 | 0 |
| 184 | 140.6 | 41.2 | 12.7 | 325.6 | 114.7 | 0 |
| 230 | 148.2 | 47.6 | 12.8 | 373.2 | 115.0 | 0 |
| 276 | 154.3 | 52.7 | 12.1 | 410.7 | 113.7 | 0 |
| 322 | 159.0 | 56.9 | 10.6 | 440.5 | 111.0 | 0 |
| 368 | 162.7 | 60.3 | 8.7 | 464.4 | 107.3 | 0 |
| 414 | 165.6 | 63.1 | 6.3 | 483.9 | 102.7 | 0 |
| 460 | 167.8 | 65.5 | 3.6 | 500.0 | 97.4 | 0 |

EXAMPLE 14

In this example a second Fresnel lens $FL_2$ was placed in the rear of the first Fresnel lens $FL_1$ according to the present invention. This example is useful for the lighting optical system of a proximity exposure device, as was similar to example 13.

Figure 26:
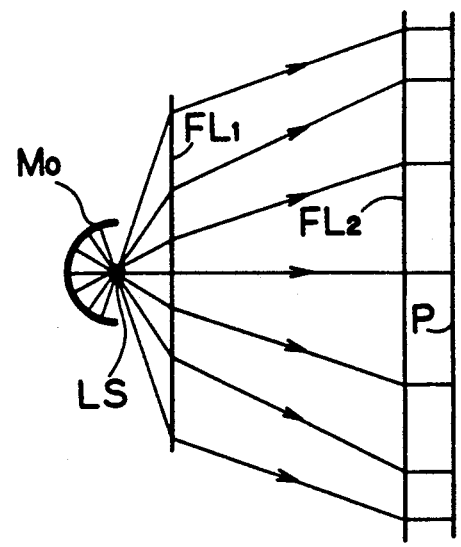

The operating conditions and Fresnel lens data are shown in Table 14 and a ray tracing view in accordance with these Fresnel lenses $FL_1$ and $FL_2$ is shown in FIG. 26.

In Table 14, $f_1$ was a focal length on an optical axis of the first Fresnel lenses $FL_1$, and $f_2$, was a focal length on an optical axis of the second Fresnel lens $FL_2$.

In this practical example, a spherical mirror $M_O$ was placed in the rear of a point light source LS.

TABLE 14

| A = 120 mm B = 480 mm C = 100 mm $f_1$ = 350 mm $f_2$ = 663 mm E = 63% n = n' = 1.5 | | | | | |
|---|---|---|---|---|---|
| H (mm) | $\theta$ (deg) | $\phi$ (deg) | $\alpha_2$ (deg) | $R_2$ (mm) | $\alpha'$ (deg) |
| 25 | 3.29 | 2.16 | 92.3 | 6.90 | 85.69 |
| 50 | 6.58 | 4.31 | 94.5 | 13.85 | 81.43 |
| 75 | 9.88 | 6.43 | 96.8 | 20.90 | 77.27 |
| 100 | 13.19 | 8.52 | 99.2 | 28.12 | 73.27 |
| 125 | 16.51 | 10.56 | 101.6 | 35.56 | 69.45 |
| 150 | 19.84 | 12.53 | 104.2 | 43.29 | 65.86 |
| 175 | 23.19 | 14.44 | 106.8 | 51.40 | 62.50 |
| 200 | 26.55 | 16.26 | 109.5 | 59.97 | 59.40 |
| 225 | 29.95 | 17.99 | 112.3 | 69.13 | 56.57 |
| 250 | 33.37 | 19.61 | 115.3 | 79.02 | 54.01 |
| 275 | 36.82 | 21.10 | 118.4 | 89.82 | 51.73 |

TABLE 14-continued

| A = 120 mm B = 480 mm C = 100 mm $f_1$ = 350 mm $f_2$ = 663 mm E = 63% n = n' = 1.5 | | | | | |
|---|---|---|---|---|---|
| H (mm) | $\theta$ (deg) | $\phi$ (deg) | $\alpha_2$ (deg) | $R_2$ (mm) | $\alpha'$ (deg) |
| 300 | 40.30 | 22.44 | 121.7 | 101.77 | 49.73 |
| 325 | 43.83 | 23.61 | 125.2 | 115.18 | 48.04 |
| 250 | 47.39 | 24.58 | 128.8 | 130.47 | 46.69 |
| 375 | 51.01 | 25.29 | 132.8 | 148.25 | 45.71 |
| 400 | 54.69 | 25.66 | 137.0 | 169.40 | 45.20 |
| 425 | 58.42 | 25.58 | 141.6 | 195.22 | 45.31 |
| 450 | 62.23 | 24.83 | 146.8 | 227.86 | 46.33 |
| 475 | 66.11 | 23.03 | 152.8 | 270.92 | 48.87 |
| 500 | 70.08 | 19.38 | 159.7 | 331.13 | 54.36 |

EXAMPLE 15

Figure 27:
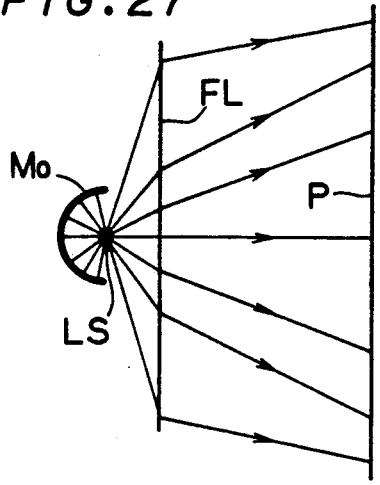

In this example an optical lighting system comprising a Fresnel lens FL was used in a projection system in which irradiance on a surface P to be irradiated was higher in the peripheral portion of the surface P. The operating parameters and lens data are shown in Table 15 and a ray tracing view in accordance with this Fresnel lens FL is shown in FIG. 27.

In this practical example, a spherical mirror $M_O$ was placed in the rear of a point light source LS.

TABLE 15

| A = 120 mm B = 480 mm f = 450 mm E = 68% n = 1.5 | | | | | |
|---|---|---|---|---|---|
| H (mm) | $\theta$ (deg) | $\phi$ (deg) | $\alpha_2$ (deg) | $R_2$ (mm) | relative irradiated |
| 25 | 3.0 | 2.2 | 91.6 | 6.3 | 1.00 |
| 50 | 6.0 | 4.4 | 93.3 | 12.7 | 1.00 |
| 75 | 9.1 | 6.6 | 95.0 | 19.3 | 1.00 |
| 100 | 12.2 | 8.7 | 96.8 | 25.9 | 1.02 |
| 125 | 15.3 | 10.8 | 98.8 | 32.9 | 1.03 |
| 150 | 18.4 | 12.8 | 100.8 | 40.1 | 1.04 |
| 175 | 21.6 | 14.8 | 103.1 | 47.7 | 1.06 |
| 200 | 24.9 | 16.7 | 105.6 | 55.8 | 1.08 |
| 225 | 28.2 | 18.4 | 108.3 | 64.5 | 1.10 |
| 250 | 31.7 | 20.1 | 111.3 | 74.1 | 1.12 |
| 275 | 35.2 | 21.6 | 114.5 | 84.6 | 1.15 |
| 300 | 38.8 | 22.9 | 118.1 | 96.4 | 1.18 |
| 325 | 42.5 | 24.1 | 122.1 | 110.0 | 1.22 |
| 350 | 46.3 | 25.0 | 126.4 | 125.8 | 1.26 |
| 375 | 50.3 | 25.6 | 131.2 | 144.8 | 1.30 |
| 400 | 54.5 | 25.7 | 136.6 | 168.3 | 1.34 |
| 425 | 58.8 | 25.2 | 142.7 | 198.6 | 1.39 |
| 450 | 63.4 | 23.6 | 149.7 | 239.9 | 1.44 |
| 475 | 68.2 | 19.9 | 157.9 | 300.5 | 1.50 |
| 500 | 73.3 | 11.7 | 166.9 | 400.5 | 1.56 |

EXAMPLE 16

Figure 28:
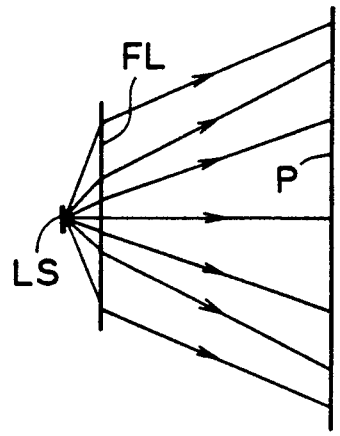

In this example an optical lighting system comprising a Fresnel lens FL was used in a projection system in which irradiance on a surface P to be irradiated was higher in the peripheral portion of the surface P, as was similar to example 15. The operating parameters and Fresnel lens data are shown in Table 16 and a ray tracing view in accordance with this Fresnel lens FL is shown in FIG. 28.

The light source LS of this practical example was formed by a surface light source which emits light only toward the Fresnel lens FL.

TABLE 16

| A = 100 mm B = 600 mm f = 650 mm E = 86% n = 1.5 | | | | | |
|---|---|---|---|---|---|
| H (mm) | $\theta$ (deg) | $\phi$ (deg) | $\alpha_2$ (deg) | $R_2$ (mm) | relative irradiated |
| 25 | 2.3 | 1.9 | 90.7 | 4.1 | 1.00 |
| 50 | 4.7 | 3.9 | 91.5 | 8.2 | 1.00 |
| 75 | 7.1 | 5.9 | 92.3 | 12.4 | 1.01 |
| 100 | 9.5 | 7.8 | 93.2 | 16.7 | 1.02 |

TABLE 16-continued

A = 100 mm B = 600 mm f = 650 mm E = 86% n = 1.5

| H (mm) | θ (deg) | φ (deg) | α₂ (deg) | R₂ (mm) | relative irradiated |
|---|---|---|---|---|---|
| 125 | 11.9 | 9.8 | 94.2 | 21.1 | 1.03 |
| 150 | 14.4 | 11.6 | 95.4 | 25.7 | 1.04 |
| 175 | 17.0 | 13.5 | 96.7 | 30.5 | 1.06 |
| 200 | 19.6 | 15.3 | 98.2 | 35.6 | 1.08 |
| 225 | 22.3 | 17.0 | 99.9 | 41.0 | 1.10 |
| 250 | 25.1 | 18.7 | 101.9 | 46.8 | 1.12 |
| 275 | 28.0 | 20.2 | 104.2 | 53.2 | 1.15 |
| 300 | 31.0 | 21.7 | 106.8 | 60.2 | 1.18 |
| 325 | 34.2 | 23.1 | 109.8 | 68.1 | 1.22 |
| 350 | 37.7 | 24.4 | 113.3 | 77.2 | 1.26 |
| 375 | 41.3 | 25.5 | 117.3 | 88.0 | 1.30 |
| 400 | 45.3 | 26.4 | 122.0 | 101.2 | 1.34 |
| 425 | 49.7 | 27.0 | 127.5 | 118.1 | 1.39 |
| 450 | 54.7 | 27.2 | 134.2 | 141.4 | 1.44 |
| 475 | 60.6 | 26.3 | 142.7 | 177.5 | 1.50 |
| 500 | 68.0 | 22.7 | 154.6 | 248.1 | 1.56 |

EXAMPLE 17

In this example a second Fresnel lens FL₂ was placed in the rear of a first Fresnel lens FL₁ according to the present invention and a pattern original OG was placed on a surface P to be irradiated, just behind the second Fresnel lens FL₂, so that the image of the pattern original OG was projected on an image surface P' through an image-formation lens IL.

Figure 29:
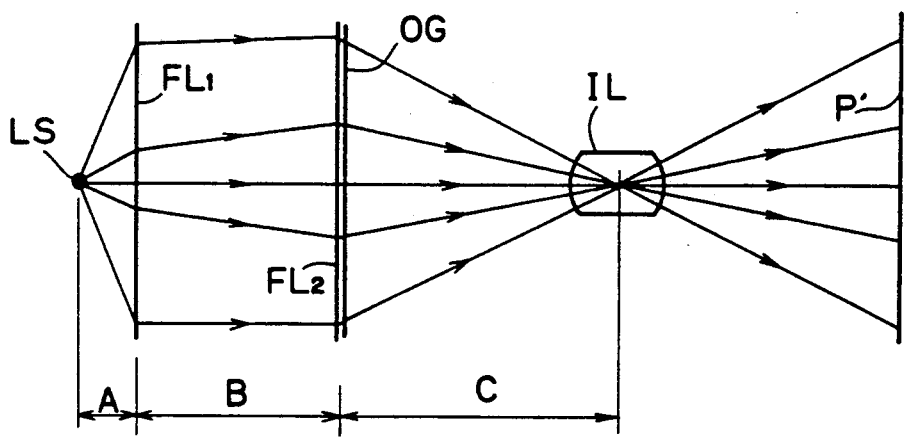

The operating conditions and Fresnel lens data are shown in Table 17 and a ray tracing view in accordance with these Fresnel lenses FL₁ and FL₂ is shown in FIG. 29.

In Table 17, B was the gap between the first and second Fresnel lenses FL₁ and FL₂, C was the a gap between the second Fresnel lens FL₂ and the image-formation lens IL, n' was the refractive index of the second Fresnel lens FL₂, α' was an angle which the Fresnel optical surface of the second Fresnel lens FL₂ makes with an optical axis, and φ' was a declination angle on the surface of the original OG.

According to this example, the plane of incidence of the second Fresnel lens FL₂ was uniformly irradiated by the first Fresnel lens FL₁ and, therefore, the original OG placed just in the rear of the second Fresnel lens FL₂ can be uniformly irradiated. The second Fresnel lens FL₂ converged light at the entrance pupil of the image-formation lens IL placed in the rear of the second Fresnel lens FL₂. Thus, an ideal Koehler illumination system was implemented.

The light source LS of this practical example was formed by a point light source.

TABLE 17

A = 220 mm B = 720 mm f = 335 mm n = 1.51
C = 1000 mm n' = 1.491

| R (mm) | α₂ (deg) | θ (deg) | φ (deg) | H (mm) | α' (deg) | φ' (deg) |
|---|---|---|---|---|---|---|
| 47.5 | 105.7 | 12.2 | 4.1 | 99.2 | 100.0 | −5.7 |
| 95 | 119.8 | 23.4 | 7.5 | 189.1 | 122.1 | −10.7 |
| 142.5 | 131.6 | 32.9 | 9.6 | 264.8 | 129.4 | −14.8 |
| 190 | 141.0 | 40.8 | 10.7 | 325.8 | 133.1 | −18.0 |
| 237.5 | 148.4 | 47.2 | 10.7 | 374.0 | 134.7 | −20.5 |
| 285 | 154.0 | 52.3 | 10.0 | 412.0 | 134.9 | −22.4 |
| 332.5 | 158.4 | 56.5 | 8.7 | 442.3 | 134.3 | −23.9 |
| 380 | 161.8 | 59.9 | 6.9 | 446.7 | 133.1 | −25.0 |
| 427.5 | 164.5 | 62.8 | 4.7 | 486.6 | 131.4 | −25.9 |
| 475 | 166.5 | 65.2 | 2.2 | 503.0 | 129.3 | −26.7 |

EXAMPLE 18

In this example a second Fresnel lens FL₂ was placed in the rear of the first Fresnel lens FL₁ according to the present invention. This example is useful for the lighting optical system of a projection device, as is similar to example 17.

Figure 30:
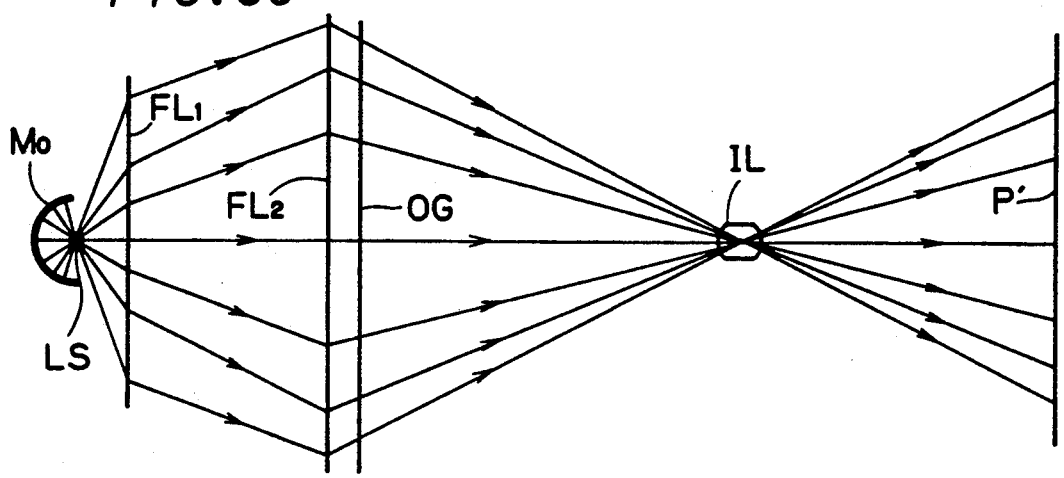

The operating conditions and Fresnel lens data are shown in Table 18 and a ray tracing view in accordance with these Fresnel lenses FL₁ and FL₂ is shown in FIG. 30.

In this example, a spherical mirror M_O was placed in the rear of a point light source LS.

TABLE 18

A = 120 mm B = 480 mm C = 1000 mm f₁ = 350 mm f₂ = 399 mm
n = n' = 1.5 E = 63%

| H (mm) | θ (deg) | φ (deg) | α₂ (deg) | R₂ (mm) | φ' (deg) | α' (deg) | relative irradiated |
|---|---|---|---|---|---|---|---|
| 25 | 3.29 | 2.16 | 92.3 | 6.90 | −1.43 | 97.1 | 1.000 |
| 50 | 6.58 | 4.31 | 94.5 | 13.85 | −2.86 | 104.1 | 1.000 |
| 75 | 9.88 | 6.43 | 96.8 | 20.90 | −4.29 | 110.1 | 1.000 |
| 100 | 13.19 | 8.52 | 99.2 | 28.12 | −5.71 | 116.4 | 1.000 |
| 125 | 16.51 | 10.56 | 101.6 | 35.56 | −7.13 | 121.7 | 1.000 |
| 150 | 19.84 | 12.53 | 104.2 | 43.29 | −8.53 | 126.4 | 1.000 |
| 175 | 23.19 | 14.44 | 106.8 | 51.40 | −9.93 | 130.5 | 1.000 |
| 200 | 26.55 | 16.26 | 109.5 | 59.97 | −11.31 | 134.0 | 1.000 |
| 225 | 29.95 | 17.99 | 112.3 | 69.13 | −12.68 | 137.0 | 1.000 |
| 250 | 33.37 | 19.61 | 115.3 | 79.02 | −14.04 | 139.6 | 1.000 |
| 275 | 36.82 | 21.10 | 118.4 | 89.82 | −15.38 | 141.8 | 1.000 |
| 300 | 40.30 | 22.44 | 121.7 | 101.77 | −16.70 | 143.6 | 1.000 |
| 325 | 43.83 | 23.61 | 125.2 | 115.18 | −18.00 | 145.1 | 1.000 |
| 350 | 47.39 | 24.58 | 128.8 | 130.47 | −19.29 | 146.3 | 1.000 |
| 375 | 51.01 | 25.29 | 132.8 | 148.25 | −20.56 | 147.2 | 1.000 |
| 400 | 54.69 | 25.66 | 137.0 | 169.40 | −21.80 | 147.7 | 1.000 |
| 425 | 58.42 | 25.58 | 141.6 | 195.22 | −23.03 | 147.9 | 1.000 |
| 450 | 62.23 | 24.83 | 146.8 | 227.86 | −24.23 | 147.5 | 1.000 |
| 475 | 66.11 | 23.03 | 152.8 | 270.92 | −25.41 | 146.4 | 1.000 |
| 500 | 70.08 | 19.38 | 159.7 | 331.13 | −26.57 | 143.9 | 1.000 |

EXAMPLE 19

Figure 31:
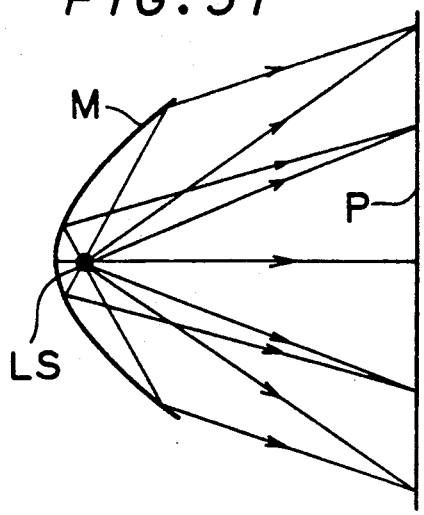

In this example an optical lighting system comprising a mirror optical system M was used in a contact or proximity exposure system in which irradiance on a surface P to be irradiated was uniform all over the surface P. The operating conditions and mirror data are shown in Table 19 and a ray tracing view in accordance with this mirror optical system M is shown in FIG. 31.

The light source LS was formed by a point light source.

TABLE 19

| | A = 50 mm B = 800 mm f = 70 mm E = 76% | | | |
|---|---|---|---|---|
| H (mm) | $\theta$ (deg) | $\phi$ (deg) | $\alpha_3$ (deg) | $R_3$ (mm) | $D_3$ (mm) |
| 25.0 | 4.8 | 1.4 | 88.3 | 4.2 | 0.0 |
| 50.0 | 9.7 | 2.9 | 86.9 | 8.5 | 0.2 |
| 75.0 | 14.6 | 4.4 | 84.8 | 12.9 | 0.5 |
| 100.0 | 19.6 | 5.8 | 83.1 | 17.4 | 1.0 |
| 125.0 | 24.6 | 7.3 | 81.3 | 22.1 | 1.6 |
| 150.0 | 29.6 | 8.7 | 79.5 | 27.0 | 2.5 |
| 175.0 | 34.7 | 10.1 | 77.6 | 32.2 | 3.5 |
| 200.0 | 39.9 | 11.5 | 75.7 | 37.8 | 4.8 |
| 225.0 | 45.2 | 12.8 | 73.7 | 43.8 | 6.5 |
| 250.0 | 50.7 | 14.1 | 71.7 | 50.5 | 8.6 |
| 275.0 | 56.2 | 15.3 | 69.5 | 58.0 | 11.2 |
| 300.0 | 61.9 | 16.5 | 67.2 | 66.5 | 14.6 |
| 325.0 | 67.9 | 17.6 | 64.8 | 76.4 | 18.9 |
| 350.0 | 74.0 | 18.6 | 62.3 | 88.1 | 24.8 |
| 375.0 | 80.4 | 19.5 | 59.5 | 102.5 | 32.8 |
| 400.0 | 87.2 | 20.2 | 56.5 | 120.7 | 44.2 |
| 425.0 | 94.4 | 20.7 | 53.1 | 144.9 | 61.3 |
| 450.0 | 102.2 | 20.8 | 49.3 | 179.0 | 88.7 |
| 475.0 | 110.7 | 20.2 | 44.7 | 230.9 | 137.3 |
| 500.0 | 120.2 | 17.8 | 38.7 | 318.2 | 235.7 |

EXAMPLE 20

Figure 32:
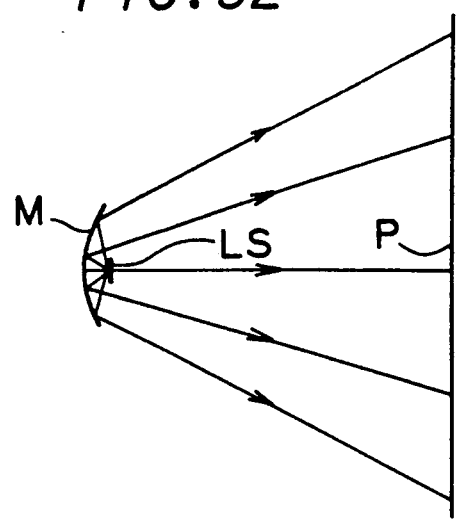

In this example an optical lighting system comprising a mirror optical system M was used in a contact or proximity exposure system in which irradiance on a surface P to be irradiated was uniform all over the surface P, as was similar to example 19. The operating conditions and mirror data are shown in Table 20 and a ray tracing view in accordance with this mirror optical system M is shown in FIG. 32.

The light source LS was a surface light source which emits light only toward the mirror M. The size of the surface light source was assumed to be negligible.

TABLE 20

| | A = 50 mm B = 800 mm f = 120 mm E = 84% | | | | |
|---|---|---|---|---|---|
| H (mm) | $\theta$ (deg) | $\phi$ (deg) | $\alpha_3$ (deg) | $R_3$ (mm) | $D_3$ (mm) |
| 25.0 | 2.7 | 1.6 | 89.4 | 2.4 | 0.0 |
| 50.0 | 5.5 | 3.2 | 88.8 | 4.8 | 0.0 |
| 75.0 | 8.3 | 4.8 | 88.2 | 7.3 | 0.1 |
| 100.0 | 11.1 | 6.4 | 87.6 | 9.8 | 0.2 |
| 125.0 | 14.0 | 8.0 | 87.0 | 12.3 | 0.3 |
| 150.0 | 16.8 | 9.5 | 86.3 | 15.0 | 0.4 |
| 175.0 | 19.7 | 11.1 | 85.6 | 17.7 | 0.6 |
| 200.0 | 22.7 | 12.6 | 84.9 | 20.6 | 0.9 |
| 225.0 | 25.8 | 14.1 | 84.1 | 23.6 | 1.1 |
| 250.0 | 28.9 | 15.6 | 83.3 | 26.7 | 1.5 |
| 275.0 | 32.1 | 17.0 | 82.4 | 30.2 | 1.9 |
| 300.0 | 35.4 | 18.4 | 81.4 | 33.8 | 2.4 |
| 325.0 | 38.9 | 19.8 | 80.4 | 37.9 | 3.1 |
| 350.0 | 42.6 | 21.1 | 79.2 | 42.4 | 3.9 |
| 375.0 | 46.5 | 22.3 | 77.9 | 47.5 | 4.9 |
| 400.0 | 50.7 | 23.5 | 76.4 | 53.4 | 6.3 |
| 425.0 | 55.3 | 24.7 | 74.6 | 60.5 | 8.1 |
| 450.0 | 60.5 | 25.7 | 72.5 | 69.5 | 10.7 |
| 475.0 | 66.8 | 26.6 | 69.8 | 81.8 | 14.9 |
| 500.0 | 75.4 | 27.1 | 65.8 | 102.3 | 23.3 |

EXAMPLE 21

Figure 33:
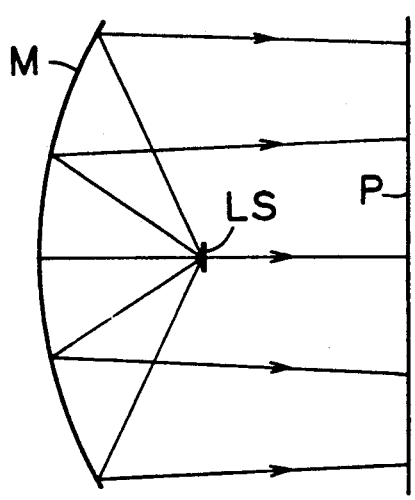

In this example an optical lighting system comprising a mirror optical system M was used in a contact or proximity exposure system in which irradiance on a surface P to be irradiated was uniform all over the surface P, as was similar to example 19. The operating parameters and mirror data are shown in Table 21 and a ray tracing view in accordance with this mirror optical system M is shown in FIG. 33.

The light source LS was a surface light source which emits light only toward the mirror M and was negligible in size. The declination angle was smaller than 3° and hence this example can be utilized in a proximity exposure system.

TABLE 21

| | A = 455 mm B = 900 mm f = 526 mm E = 68% | | | | |
|---|---|---|---|---|---|
| H (mm) | $\theta$ (deg) | $\phi$ (deg) | $\alpha_3$ (deg) | $R_3$ (mm) | $D_3$ (mm) |
| 25.0 | 2.4 | 0.3 | 88.9 | 19.7 | 0.1 |
| 50.0 | 4.9 | 0.6 | 87.8 | 39.5 | 0.7 |
| 75.0 | 7.4 | 0.9 | 86.7 | 59.4 | 1.6 |
| 100.0 | 9.9 | 1.3 | 85.6 | 79.6 | 3.0 |
| 125.0 | 12.5 | 1.5 | 84.5 | 100.0 | 4.7 |
| 150.0 | 15.0 | 1.8 | 83.3 | 120.7 | 6.9 |
| 175.0 | 17.6 | 2.1 | 82.2 | 141.8 | 9.6 |
| 200.0 | 20.3 | 2.3 | 81.0 | 163.5 | 12.8 |
| 225.0 | 22.9 | 2.5 | 79.7 | 185.8 | 16.5 |
| 250.0 | 25.7 | 2.6 | 78.4 | 208.8 | 21.0 |
| 275.0 | 28.4 | 2.7 | 77.1 | 232.7 | 26.1 |
| 300.0 | 31.3 | 2.7 | 75.7 | 257.6 | 32.1 |
| 325.0 | 34.3 | 2.7 | 74.2 | 283.8 | 39.1 |
| 350.0 | 37.3 | 2.5 | 72.6 | 311.4 | 47.4 |
| 375.0 | 40.5 | 2.3 | 70.8 | 340.7 | 57.1 |
| 400.0 | 43.9 | 1.9 | 68.9 | 372.2 | 68.6 |
| 425.0 | 47.4 | 1.2 | 66.9 | 406.4 | 82.4 |
| 450.0 | 51.3 | 0.4 | 64.5 | 444.0 | 99.4 |
| 475.0 | 55.4 | −0.8 | 61.8 | 486.1 | 120.6 |
| 500.0 | 60.1 | −2.6 | 58.6 | 534.4 | 148.2 |

EXAMPLE 22

Figure 34:
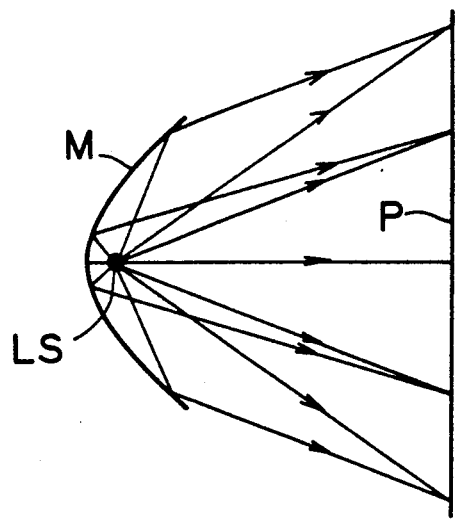

In this example an optical lighting system comprising a mirror optical system M was used in a projection system in which irradiance on a surface P to be irradiated was higher in the peripheral portion of the surface P. The operating parameters and mirror data are shown in Table 22 and a ray tracing view in accordance with this mirror optical system M is shown in FIG. 34.

This example utilized an image-formation lens, the effective field angle of which is defined to be 45°, and was adapted to unify the irradiance of an image surface.

TABLE 22

| | A = 50 mm B = 800 mm f = 75 mm E = 72% | | | | | |
|---|---|---|---|---|---|---|
| H (mm) | $\theta$ (deg) | $\phi$ (deg) | $\alpha_3$ (deg) | $R_3$ (mm) | $D_3$ (mm) | relative irradiated |
| 25.0 | 4.2 | 1.5 | 88.6 | 3.7 | 0.0 | 1.00 |
| 50.0 | 8.6 | 3.0 | 87.2 | 7.5 | 0.2 | 1.00 |
| 75.0 | 12.9 | 4.5 | 85.8 | 11.3 | 0.4 | 1.01 |
| 100.0 | 17.3 | 6.0 | 84.3 | 15.3 | 0.7 | 1.01 |
| 125.0 | 21.7 | 7.5 | 82.8 | 19.4 | 1.2 | 1.02 |
| 150.0 | 26.2 | 8.9 | 81.3 | 23.8 | 1.8 | 1.03 |
| 175.0 | 30.9 | 10.4 | 79.7 | 28.3 | 2.5 | 1.04 |
| 200.0 | 35.6 | 11.8 | 78.0 | 33.3 | 3.5 | 1.06 |
| 225.0 | 40.5 | 13.1 | 76.3 | 38.6 | 4.7 | 1.07 |
| 250.0 | 45.5 | 14.5 | 74.4 | 44.5 | 6.2 | 1.09 |
| 275.0 | 50.7 | 15.7 | 72.5 | 51.1 | 8.2 | 1.15 |
| 300.0 | 56.1 | 17.0 | 70.4 | 58.5 | 10.7 | 1.13 |
| 325.0 | 61.8 | 18.1 | 68.1 | 67.2 | 14.0 | 1.15 |
| 350.0 | 67.8 | 19.2 | 65.7 | 77.4 | 18.3 | 1.18 |
| 375.0 | 74.1 | 20.1 | 63.0 | 90.0 | 24.4 | 1.20 |
| 400.0 | 80.8 | 20.9 | 60.0 | 105.8 | 33.0 | 1.23 |
| 425.0 | 88.1 | 21.5 | 56.7 | 126.8 | 45.9 | 1.27 |
| 450.0 | 96.1 | 21.8 | 52.8 | 156.1 | 66.7 | 1.30 |
| 475.0 | 104.9 | 21.4 | 48.2 | 200.7 | 103.5 | 1.34 |
| 500.0 | 115.0 | 19.7 | 42.3 | 276.7 | 179.1 | 1.3 |

EXAMPLE 23

Figure 35:
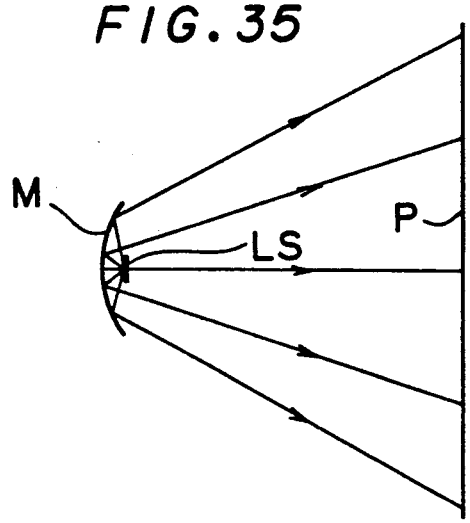

In this example an optical lighting system comprising a mirror optical system M was used in a projection system in which irradiance on a surface P to be irradiated was higher in the peripheral portion of the surface P, as was similar to example 22. Operating conditions and mirror data are shown in Table 23 and a ray tracing view in accordance with this mirror optical system M is shown in FIG. 35.

This example utilized an image-formation lens, the effective field angle of which was defined to unify the irradiance of an image surface.

The light source LS was formed by a surface light source which emits light only toward the mirror M and was negligible in size.

TABLE 23

A = 50 mm  B = 800 mm  f = 150 mm  E = 84%

| H (mm) | θ (deg) | φ (deg) | α₃ (deg) | R₃ (mm) | D₃ (mm) | relative irradiated |
|---|---|---|---|---|---|---|
| 25.0 | 2.4 | 1.6 | 89.5 | 2.1 | 0.0 | 1.00 |
| 50.0 | 4.9 | 3.2 | 89.1 | 4.3 | 0.0 | 1.00 |
| 75.0 | 7.4 | 4.8 | 88.7 | 6.4 | 0.0 | 1.01 |
| 100.0 | 9.9 | 6.5 | 88.2 | 8.7 | 0.1 | 1.02 |
| 125.0 | 12.4 | 8.1 | 87.8 | 11.0 | 0.2 | 1.03 |
| 150.0 | 15.0 | 9.6 | 87.3 | 13.3 | 0.3 | 1.04 |
| 175.0 | 17.7 | 11.2 | 86.7 | 15.8 | 0.4 | 1.06 |
| 200.0 | 20.4 | 12.7 | 86.1 | 18.4 | 0.5 | 1.08 |
| 225.0 | 23.2 | 14.3 | 85.5 | 21.1 | 0.7 | 1.10 |
| 250.0 | 26.2 | 15.7 | 84.7 | 24.1 | 1.0 | 1.12 |
| 275.0 | 29.2 | 17.2 | 83.9 | 37.2 | 1.3 | 1.15 |
| 300.0 | 32.5 | 18.6 | 83.0 | 30.7 | 1.7 | 1.18 |
| 325.0 | 35.9 | 20.0 | 82.0 | 34.6 | 2.2 | 1.22 |
| 350.0 | 39.5 | 21.3 | 80.8 | 38.9 | 2.0 | 1.26 |
| 375.0 | 43.5 | 22.5 | 79.5 | 43.9 | 3.7 | 1.30 |
| 400.0 | 47.8 | 23.7 | 77.9 | 49.7 | 4.9 | 1.34 |
| 425.0 | 52.6 | 24.8 | 76.1 | 56.9 | 6.5 | 1.39 |
| 450.0 | 58.2 | 25.8 | 73.7 | 66.2 | 9.0 | 1.44 |
| 475.0 | 65.1 | 26.6 | 70.7 | 79.3 | 13.2 | 1.50 |
| 500.0 | 75.0 | 27.0 | 65.9 | 102.7 | 22.6 | 1.56 |

EXAMPLE 24

Figure 36:
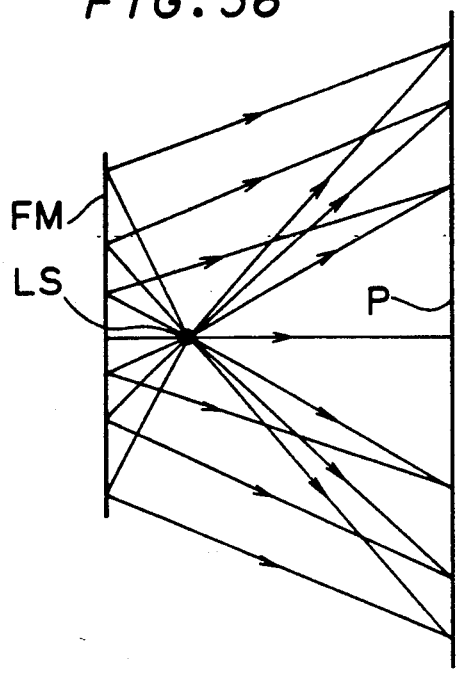

In this example an optical lighting system comprising a Fresnel mirror FM was used in a contact or proximity exposure system in which irradiance on a surface P to be irradiated was uniform all over the surface P. Operating conditions and mirror data are shown in Table 24 and a ray tracing view in accordance with this Fresnel mirror FM is shown in FIG. 36.

A light source LS was assumed to be formed by a point light source which has uniform radiant intensity J(θ).

TABLE 24

A = 150 mm  B = 600 mm  f = 2000 mm  E = 40%

| H (mm) | θ (deg) | φ (deg) | α₃ (deg) | R₃ (mm) |
|---|---|---|---|---|
| 25 | 1.9 | 1.9 | 89.9 | 5.0 |
| 50 | 3.9 | 3.7 | 89.9 | 10.2 |
| 75 | 5.9 | 5.6 | 89.8 | 15.6 |
| 100 | 8.0 | 7.4 | 89.6 | 21.3 |
| 125 | 10.3 | 9.2 | 89.4 | 27.3 |
| 150 | 12.7 | 10.9 | 89.1 | 33.9 |
| 175 | 15.2 | 12.5 | 88.6 | 40.9 |
| 200 | 17.9 | 14.1 | 88.0 | 48.6 |
| 225 | 20.8 | 15.6 | 87.4 | 57.0 |
| 250 | 23.8 | 17.0 | 86.6 | 66.1 |
| 275 | 26.9 | 18.3 | 85.6 | 76.2 |
| 300 | 30.2 | 19.5 | 84.6 | 87.3 |
| 325 | 33.6 | 20.5 | 83.4 | 99.6 |
| 350 | 37.1 | 21.5 | 82.1 | 113.5 |
| 375 | 40.7 | 22.2 | 80.7 | 129.3 |
| 400 | 44.5 | 22.8 | 79.1 | 147.6 |
| 425 | 48.4 | 23.0 | 77.3 | 169.1 |
| 450 | 52.4 | 23.0 | 75.2 | 195.0 |
| 475 | 56.5 | 22.4 | 72.9 | 227.2 |
| 500 | 60.8 | 21.0 | 70.1 | 268.7 |

EXAMPLE 25

Figure 37:
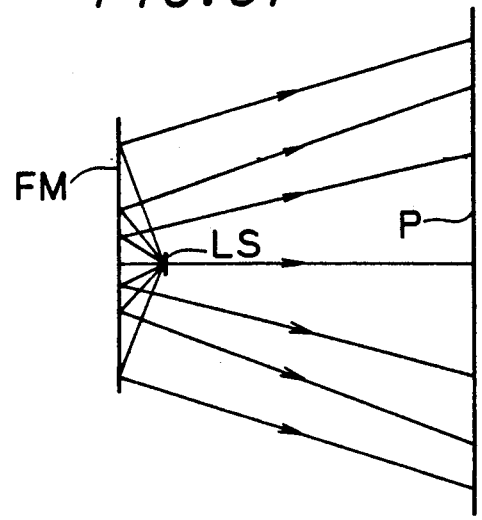

In this example an optical lighting system comprising a Fresnel mirror FM was used in a contact or proximity exposure system in which irradiance on a surface P to be irradiated was uniform all over the surface P, as was similar to the twenty-fourth practical example. Operating parameters and mirror data are shown in Table 25 and a ray tracing view in accordance with this Fresnel mirror FM is shown in FIG. 37.

The light source LS was formed by a surface illuminant which emitted light only toward the mirror M and was negligible in size.

TABLE 25

A = 100 mm  B = 800 mm  f = 220 mm  E = 78%

| H (mm) | θ (deg) | φ (deg) | α₃ (deg) | R₃ (mm) |
|---|---|---|---|---|
| 25 | 2.6 | 1.4 | 89.3 | 4.6 |
| 50 | 5.3 | 2.9 | 88.7 | 9.3 |
| 75 | 8.0 | 4.3 | 88.1 | 14.1 |
| 100 | 10.7 | 5.7 | 87.5 | 18.9 |
| 125 | 13.4 | 7.1 | 86.8 | 23.9 |
| 150 | 16.2 | 8.5 | 86.1 | 29.1 |
| 175 | 19.0 | 9.9 | 85.4 | 34.5 |
| 200 | 21.8 | 11.2 | 84.7 | 40.1 |
| 225 | 24.8 | 12.5 | 83.8 | 46.2 |
| 250 | 27.7 | 13.8 | 83.0 | 52.6 |
| 275 | 30.8 | 15.0 | 82.1 | 59.7 |
| 300 | 34.0 | 16.2 | 81.0 | 67.4 |
| 325 | 37.2 | 17.2 | 79.9 | 76.1 |
| 350 | 40.7 | 18.2 | 78.7 | 86.1 |
| 375 | 44.3 | 19.1 | 77.3 | 97.7 |
| 400 | 48.2 | 19.8 | 75.7 | 111.9 |
| 425 | 52.4 | 20.2 | 73.9 | 129.8 |
| 450 | 57.0 | 20.2 | 71.6 | 154.1 |
| 475 | 62.3 | 19.5 | 68.6 | 190.6 |
| 500 | 68.7 | 16.8 | 64.0 | 257.5 |

EXAMPLE 26

Figure 38:
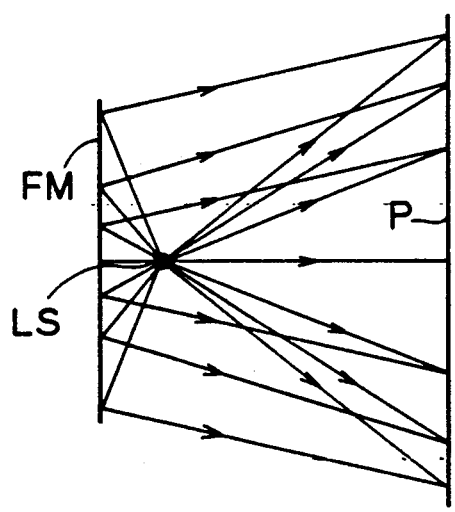

In this example an optical lighting system comprising a Fresnel mirror FM was used in a projection system in which irradiance on a surface P to be irradiated was higher in the peripheral portion of the surface P. Operating parameters and mirror data are shown in Table 26 and a ray tracing view in accordance with this Fresnel mirror FM is shown in FIG. 38.

This example used an image-formation lens, the effective field angle of which was assumed to be 45°, and was adapted to unify the irradiance of an image surface.

A light source LS was formed by a point light source which is assumed to be uniform in radiant intensity J(θ).

TABLE 26

A = 150 mm  B = 600 mm  f = 2000 mm  E = 37%

| H (mm) | θ (deg) | φ (deg) | α₃ (deg) | R₃ (mm) | relative irradiated |
|---|---|---|---|---|---|
| 25 | 2.4 | 1.3 | 89.4 | 6.4 | 1.00 |
| 50 | 4.9 | 2.6 | 88.8 | 13.0 | 1.01 |
| 75 | 7.4 | 3.9 | 88.2 | 19.6 | 1.01 |
| 100 | 10.0 | 5.2 | 87.6 | 26.5 | 1.02 |
| 125 | 12.6 | 6.5 | 86.9 | 33.6 | 1.03 |
| 150 | 15.2 | 7.7 | 86.2 | 41.0 | 1.05 |
| 175 | 18.0 | 8.9 | 85.4 | 48.8 | 1.06 |
| 200 | 20.8 | 10.1 | 84.6 | 57.1 | 1.08 |
| 225 | 23.7 | 11.2 | 83.7 | 66.1 | 1.10 |
| 250 | 26.8 | 12.2 | 82.7 | 75.8 | 1.13 |
| 275 | 29.9 | 13.2 | 81.6 | 86.5 | 1.16 |
| 300 | 33.2 | 14.1 | 80.4 | 98.3 | 1.19 |
| 325 | 36.6 | 14.9 | 79.1 | 111.6 | 1.22 |
| 350 | 40.2 | 15.5 | 77.6 | 126.7 | 1.26 |
| 375 | 43.9 | 16.0 | 76.0 | 144.4 | 1.30 |
| 400 | 47.7 | 16.3 | 74.2 | 165.4 | 1.35 |
| 425 | 51.8 | 16.3 | 72.2 | 191.0 | 1.39 |

TABLE 26-continued

| A = 150 mm B = 600 mm f = 2000 mm E = 37% | | | | | |
|---|---|---|---|---|---|
| H (mm) | $\theta$ (deg) | $\phi$ (deg) | $\alpha_3$ (deg) | $R_3$ (mm) | relative irradiated |
| 450 | 56.1 | 15.8 | 69.8 | 223.4 | 1.45 |
| 475 | 60.6 | 14.6 | 66.9 | 266.4 | 1.50 |
| 500 | 65.3 | 12.2 | 63.4 | 326.9 | 1.56 |

EXAMPLE 27

Figure 39:
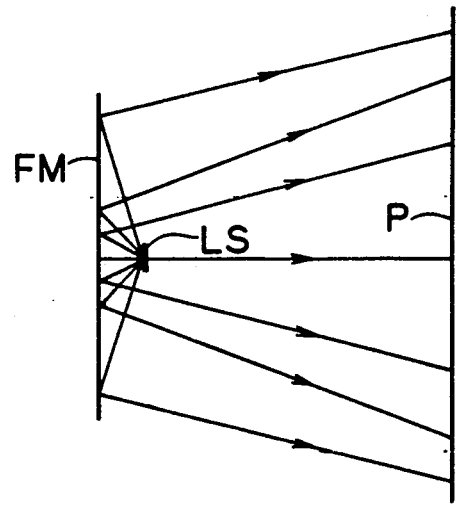

In this example an optical lighting system comprising a Fresnel mirror FM was used in a projection system in which irradiance on a surface P to be irradiated was higher in the peripheral portion of the surface P. The operating parameters and mirror data are shown in Table 27 and a ray tracing view in accordance with this Fresnel mirror FM is shown in FIG. 39.

A light source LS was formed by a surface light source which emitted light only toward the mirror M and was negligible in size.

TABLE 27

| A = 100 mm B = 800 mm f = 260 mm E = 82% | | | | | |
|---|---|---|---|---|---|
| H (mm) | $\theta$ (deg) | $\phi$ (deg) | $\alpha_3$ (deg) | $R_3$ (mm) | relative irradiated |
| 25 | 2.4 | 1.4 | 89.5 | 4.2 | 1.00 |
| 50 | 4.8 | 2.9 | 89.0 | 8.4 | 1.00 |
| 75 | 7.2 | 4.4 | 88.5 | 12.8 | 1.01 |
| 100 | 9.7 | 5.9 | 88.0 | 17.2 | 1.01 |
| 125 | 12.2 | 7.3 | 87.5 | 21.7 | 1.03 |
| 150 | 14.8 | 8.7 | 86.9 | 26.4 | 1.04 |
| 175 | 17.4 | 10.1 | 86.3 | 31.4 | 1.06 |
| 200 | 20.1 | 11.5 | 85.6 | 36.6 | 1.08 |
| 225 | 22.9 | 12.8 | 84.9 | 42.2 | 1.10 |
| 250 | 25.8 | 14.1 | 84.1 | 48.3 | 1.12 |
| 275 | 28.8 | 15.3 | 83.2 | 55.0 | 1.15 |
| 300 | 31.9 | 16.5 | 82.2 | 62.4 | 1.18 |
| 325 | 35.3 | 17.6 | 81.1 | 70.8 | 1.22 |
| 350 | 38.8 | 18.6 | 79.8 | 80.5 | 1.26 |
| 375 | 42.6 | 19.4 | 78.3 | 92.2 | 1.30 |
| 400 | 46.8 | 20.1 | 76.6 | 106.8 | 1.34 |
| 425 | 51.5 | 20.4 | 74.4 | 125.9 | 1.39 |
| 450 | 56.9 | 20.3 | 71.7 | 153.4 | 1.44 |
| 475 | 63.3 | 19.0 | 67.8 | 199.4 | 1.50 |
| 500 | 72.1 | 13.3 | 60.6 | 309.7 | 1.56 |

Although the above Examples 1-18 have been described with respect to a lens optical system which has a spherical incidence plane surface, the plane of incidence may be an aspheric surface as is similar to the outgoing plane $F_2$ of the lens optical system.

Further, the light source LS may be a secondary light source formed by converging means such as another reflecting mirror.

Although the present invention has been described and illustrated in connection with preferred embodiments thereof, many other variations and modifications will now become apparent to those skilled in the art without departing from the scope of the invention. It is preferred therefore that the present invention be limited not by the specific disclosure herein, but only by the appended claims.

WHAT IS CLAIMED IS:

1. An optical lighting system for radiating light emitted from a light source to a surface, comprising:

an optical lens associated with a longitudinal optical axis for radiating the light from the light source, the optical lens having an incident light plane and an existing light plane;

the incident light plane and exiting light plane being oriented with respect to the longitudinal optical axis; the orientation of the incident light plane and exiting light plane being effective to produce irradiance on the surface at a point H defined by S(H), and being so that a light ray proceeding from the light source to the incident light plane makes an angle $\theta$ with the longitudinal optical axis such that the relationship between S(H) and $\theta$ is defined by:

$$\int S(H)HdH = \int J(\theta) \sin\theta d\theta$$

and an angle $\alpha_1$ made by the incident light plane and the optical axis, is defined by:

$$\tan\alpha_1 = (-n\cos\theta_1 = \cos\theta)/(n\sin\theta_1 - \sin\theta)$$

and an angle $\alpha_2$, which is the angle made by the exiting light plane and the longitudinal optical axis, is defined by:

$$\tan\alpha_2 = (-n\cos\theta_1 + \cos\theta)/(n\sin\theta_1, -\sin\phi)$$

wherein, $J(\theta)$ is the radiant intensity of the light source, n is the refractive index of the optical lens system, $\theta_1$ is an angle which a light ray proceeding through the optical lens makes with the longitudinal optical axis, and $\phi$ is an angle a ray proceeding from the exiting plane to the surface makes with the longitudinal optical axis.

2. An optical lighting system as claimed in claim 1, wherein the optical lens comprises a Fresnel lens, the incident light plane comprises a flat incident light plane and the exiting light plane comprises a plurality of concentric Fresnel optical surfaces, the angle $\alpha_2$ which the plurality of Fresnel optical surfaces make with the optical axis being defined by:

$$\tan\alpha_2 = (-\sqrt{n^2 - \sin^2\theta} + \cos\phi)/(\sin\theta - \sin\phi).$$

* * * * *